(12) United States Patent
Washio

(10) Patent No.: US 9,508,959 B2
(45) Date of Patent: Nov. 29, 2016

(54) ORGANIC EL DEVICE AND METHOD FOR MANUFACTURING SAME

(71) Applicant: KANEKA CORPORATION, Osaka-shi, Osaka (JP)

(72) Inventor: Takahiro Washio, Aomori (JP)

(73) Assignee: KANEKA CORPORATION, Osaka-shi (JP)

(*) Notice: Subject to any disclaimer, the term of this patent is extended or adjusted under 35 U.S.C. 154(b) by 86 days.

(21) Appl. No.: 14/399,896

(22) PCT Filed: Apr. 26, 2013

(86) PCT No.: PCT/JP2013/062453
§ 371 (c)(1),
(2) Date: Nov. 7, 2014

(87) PCT Pub. No.: WO2013/168619
PCT Pub. Date: Nov. 14, 2013

(65) Prior Publication Data
US 2015/0123095 A1 May 7, 2015

(30) Foreign Application Priority Data

May 10, 2012 (JP) .................. 2012-108106
Jun. 14, 2012 (JP) .................. 2012-135238

(51) Int. Cl.
*H01L 51/50* (2006.01)
*H01L 51/52* (2006.01)
(Continued)

(52) U.S. Cl.
CPC .......... *H01L 51/529* (2013.01); *H01L 27/329* (2013.01); *H01L 27/3279* (2013.01);
(Continued)

(58) Field of Classification Search
CPC ................... H01L 2251/5361; H01L 51/529; H01L 51/5203; H01L 51/5212; H01L 51/5228; H01L 27/3279; H01L 27/3288–27/329
See application file for complete search history.

(56) References Cited

U.S. PATENT DOCUMENTS 8,648,382 B2 * 2/2014 Miyai ................. H01L 51/5203
257/98
2007/0052356 A1 * 3/2007 Kawauchi .......... H01L 51/0017
313/512

(Continued)

FOREIGN PATENT DOCUMENTS

JP    2002093573 A    3/2002
JP    2007080569 A    3/2007

(Continued)

OTHER PUBLICATIONS

Machine Translation of Takamura (JP 2011-096374 A).*

(Continued)

Primary Examiner — Marvin Payen
Assistant Examiner — Jeremy Joy
(74) Attorney, Agent, or Firm — Alleman Hall McCoy Russell & Tuttle LLP

(57) ABSTRACT

An organic Electro Luminescence device that equalizes heat generated in an organic EL element while preventing the intrusion of moisture. A light emitting element is covered with an inorganic sealing layer, an adhesive layer, an insulating resin film, and a metallic foil. The organic EL device includes a current carrying area located outside and along an edge of an emission area. A heat-conductive sealing stacked layer structure is formed in the current carrying area and includes the following layers in direct contact with each other in the following order: a first electrode layer extended from the emission area, auxiliary electrode layers having heat conductivity larger than that of the first electrode layer, the inorganic sealing layer, the adhesive layer, and a heat-conductive sealing layer. The heat-conductive sealing stacked layer structure having a linear shape is located near at least one side of a transparent substrate.

24 Claims, 14 Drawing Sheets

(51) Int. Cl.
*H01L 27/32* (2006.01)
*H01L 51/56* (2006.01)
(52) U.S. Cl.
CPC ....... *H01L27/3288* (2013.01); *H01L 51/5203* (2013.01); *H01L 51/5212* (2013.01); *H01L 51/5228* (2013.01); *H01L 51/5243* (2013.01); *H01L 51/5253* (2013.01); *H01L 51/56* (2013.01); *H01L 2251/5361* (2013.01)

(56) References Cited

U.S. PATENT DOCUMENTS

| | | | | |
|---|---|---|---|---|
| 2007/0222908 | A1* | 9/2007 | Kim | G02F 1/1362 349/43 |
| 2008/0088227 | A1* | 4/2008 | Lee | H01L 51/5203 313/504 |
| 2011/0300770 | A1* | 12/2011 | Fukuda | B32B 15/08 445/58 |
| 2012/0007134 | A1* | 1/2012 | Miyai | H01L 51/5203 257/99 |
| 2013/0010482 | A1* | 1/2013 | Choi | H01L 51/5212 362/398 |
| 2013/0093308 | A1* | 4/2013 | Kagotani | B32B 17/10036 313/45 |

FOREIGN PATENT DOCUMENTS

| | | | | |
|---|---|---|---|---|
| JP | 2010198980 A | | 9/2010 | |
| JP | WO 2010098392 A1 | * | 9/2010 | ......... H01L 51/5203 |
| JP | 2010231977 A | * | 10/2010 | |
| JP | 2010245026 A | | 10/2010 | |
| JP | 2011096374 A | * | 5/2011 | |

OTHER PUBLICATIONS

International Bureau of WIPO, International Preliminary Report on Patentability Issued in Application No. PCT/JP2013/062453, Nov. 20, 2014, WIPO, 10 pages.
ISA Japanese Patent Office, International Search Report of PCT/JP2013/062453, Aug. 6, 2013, WIPO, 4 pages.
European Patent Office, Supplementary European Search Report Issued in Patent Application No. 13787451, Search Completed Dec. 22, 2015, Germany, 2 pages.

* cited by examiner

FIG. 7 SECTIONAL VIEW TAKEN ON LINE B-B

ORGANIC EL DEVICE AND METHOD FOR MANUFACTURING SAME

TECHNICAL FIELD

The present invention relates to an organic EL (Electro Luminescence) device. The present invention also relates to a method for manufacturing the EL device.

BACKGROUND ART

Nowadays, the organic EL device attracts attention as the lighting device replacing an incandescent lamp and a fluorescent lamp, and many studies are made on the organic EL device.

As used herein, the organic EL device means one in which an organic EL element is stacked on transparent substrates such as a glass substrate and a transparent resin film. In the organic EL element, two electrodes in which one or both the electrodes have translucency are opposed to each other, and a light emitting layer made of an organic compound is stacked between the electrodes. The organic EL device emits light by energy of recombination of an electron and a hole that are electrically excited.

That is, the organic EL device is a self-luminous device, and the organic EL device can emit the light having various wavelengths by properly selecting a material for the light emitting layer. The organic EL device is extremely thin compared with an incandescent lamp and a fluorescent lamp, and the organic EL device planarly emits the light. Therefore, there is few restrictions to an installation place.

In order to prevent moisture or oxygen (hereinafter, also referred to as water and the like) from invading in the organic EL element, the organic EL device has a sealing structure that blocks the organic EL element from an external atmosphere. However, in the case where the organic EL element has the insufficient sealing function, a non-luminous point called a dark spot is generated after a long period of use of the organic EL device.

The dark spot will be described in detail. In the case where the organic EL element has the insufficient sealing function, the water and the like invade in the sealing structure, and the organic EL element is exposed to the water and the like. At this point, when the organic EL element is used (lit), the electrode constituting the organic EL element is partially oxidized, and an insulating oxide layer is formed on the surface of the electrode. When the oxide layer is formed, a place where the oxide layer is formed is partially insulated. Therefore, the place does not emit the light during the lighting, but the non-luminous point (dark spot) is formed. In order to prevent the formation of the dark spot in the organic EL device, it is necessary to surely prevent the water and the like from invading in the organic EL element.

It is well known that the dark spot has a size invisible to naked eyes, formed at the beginning of the use, and it is well known that the dark spot grows with the dark spot formed at the beginning of the use as a nuclear.

The growth and expansion of the dark spot adversely affect durability and quality of the organic EL device. It is well known that generally the growth of the dark spot is promoted at an accelerated rate by heat generated in the organic EL element during the lighting.

That is, in order to constrain the growth of the formed dark spot, it is necessary that the heat generated in the organic EL element during the lighting be not retained in the organic EL element, but efficiently released to the outside.

Patent Document 1 discloses a technology of preventing the water invasion and heat retention during the lighting in the organic EL element.

The organic EL device of Patent Document 1 has an organic EL element having a structure in which a first electrode (electrode), an organic compound layer (light emitting layer), and a second electrode (electrode) are sequentially stacked on a substrate. In the organic EL device of Patent Document 1, an inorganic moisture-proof layer and a metallic conductive sealing member are provided on the second electrode. In the organic EL device of Patent Document 1, an insulating adhesive layer is interposed between the inorganic moisture-proof layer and the conductive sealing member. A conductive sealing material having excellent sealing performance (barrier property) and heat-transfer performance (heat-transfer property) is used as a conductive sealing member in the organic EL device of Patent Document 1.

In the organic EL device of Patent Document 1, using the excellent sealing performance and heat-transfer performance of the conductive sealing material, not only the water and the like is prevented from invading in the organic EL element, but also the heat is prevented from retaining on a surface (emission surface) that emits the light during lighting.

PRIOR ART DOCUMENT

Patent Document

Patent Document 1: JP 2010-245026 A

DISCLOSURE OF INVENTION

Technical Problem

As described above, the organic EL device of Patent Document 1 has a constant sealing performance and heat-transfer performance. In the organic EL device of Patent Document 1, a problem of a short circuit with the electrode due to the use of the conductive sealing material is dealt with by interposing the insulating adhesive layer between the inorganic moisture-proof layer and the conductive sealing member.

However, in the organic EL device of Patent Document 1, the conductive sealing material is placed only on an area where the organic EL element actually emits the light (hereinafter, also referred to as an emission area). Therefore, almost all parts of the heat generated during the lighting remains in the emission area.

Additionally, in the organic EL device of Patent Document 1, a first electrode and second electrode are extended to an outside of the sealing structure to form extraction electrodes in order to apply a voltage to the electrode of the organic EL element in the emission area. In the extraction electrodes, because both the first electrode and the second electrode are in direct contact with each other on the substrate, the extraction electrodes have difficulty in the sealing property and heat-transfer property over time, which results in a problem in that reliability is lacked.

Thus, the structure of the organic EL device of Patent Document 1 is not enough to effectively achieve a balance between the sealing performance and the heat-transfer performance, but has room for improvement.

The present invention provides an organic EL device that can efficiently equalize the heat generated in the organic EL element during the use while preventing the moisture or oxygen from invading the organic EL element.

Solution to Problem

In consideration of the structure of Patent Document 1, the present inventors stacked the inorganic sealing layer on the organic EL element not only in the emission area where the organic EL element that actually emits the light during the lighting is located but also in part of a feeding area through which power is fed to the light emitting element in the emission area, and bonded a metallic foil having a heat equalizing property and a sealing property onto the inorganic sealing layer using an adhesive having a good heat conductivity.

Therefore, the inventors increased a sealing area while increasing an area where the heat generated in the light emitting element in the emission area can be equalized, and tries to more surely prevent the invasion of the water and the like.

As a result of repetitive experiments for this structure, the inventors found that the sealing property and the heat-transfer property are significantly improved by removing part of the organic light emitting layer in the feeding area.

In accordance with a first aspect of the present invention, an organic EL device includes: an organic EL element in which a first electrode layer, an organic light emitting layer, and a second electrode layer are stacked on one of principal surfaces of a polygonal transparent substrate; an emission area that emits light during operation and that is observable when the transparent substrate is viewed in a planar view, an inorganic sealing layer, an adhesive layer, and a heat-conductive sealing layer being stacked on the organic EL element including at least the emission area; and a current carrying area that is provided outside the emission area and along a part or whole of an outer edge of the emission area and that is observable when the transparent substrate is viewed in a planar view, wherein a heat-conductive sealing stacked layer structure is formed in the current carrying area, the first electrode layer extended from the emission area, a electroconductive layer having a heat conductivity larger than that of the first electrode layer, the inorganic sealing layer, the adhesive layer, and the heat-conductive sealing layer being stacked in this order so as to be in contact with each other in the heat-conductive sealing stacked layer structure, and the heat-conductive sealing stacked layer structure having a linear or planar shape is located near one of or all the sides of the transparent substrate, and extended along each corresponding side.

In the organic EL device of the first aspect, the organic EL element (hereinafter, also referred to as a light emitting element) included in the emission area that emits the light during the operation is a region in which the first electrode layer, the organic light emitting layer, and the second electrode layer overlap one another, and the organic light emitting layer planarly emits the light by applying the voltage between the first electrode layer and the second electrode layer.

In the organic EL device of the first aspect, the inorganic sealing layer, the adhesive layer, and the heat-conductive sealing layer are stacked on at least the light emitting element. That is, the light emitting element is covered with the inorganic sealing layer, the adhesive layer, and the heat-conductive sealing layer to prevent the water and the like from invading into the light emitting element in the member thickness direction. Almost all parts of the heat generated from the light emitting element during the use is successfully dissipated and equalized in the heat-conductive sealing layer by locating the heat-conductive sealing layer having the heat-transfer property on a projection plane in the member thickness direction of the light emitting element.

The organic EL device of the first aspect includes the current carrying area that is provided outside the emission area and along a part or whole of an outer edge of the emission area. The heat-conductive sealing stacked layer structure is formed in the current carrying area. The first electrode layer extended from the emission area, the electroconductive layer having heat conductivity larger than that of the first electrode layer, the inorganic sealing layer, the adhesive layer, and the heat-conductive sealing layer are stacked in this order in the heat-conductive sealing stacked layer structure so as to be in contact with each other. That is, the heat generated from the light emitting element during the use is released to the current carrying area outside the emission area via the first electrode layer included in the current carrying area, and transferred to the heat-conductive sealing layer via the electroconductive layer in the current carrying area, whereby the heat is successfully dissipated and equalized in the whole heat-conductive sealing layer. Therefore, a heat equalizing area and a heat dissipation area can largely be secured.

In the organic EL device of the first aspect, the heat-conductive sealing stacked layer structure having a linear or planar shape is located near one of or all the sides of the transparent substrate, and extended along each corresponding side. Therefore, a minimum heat-transfer area can be ensured in the current carrying area in order to release the heat from the first electrode layer to the heat-conductive sealing layer, and the efficient release of the heat is successfully performed.

Thus, in the organic EL device of the first aspect, no only the region above the light emitting element but also the region around the light emitting element can be used as a pathway through which the heat generated in the light emitting element during the use is released. This enables the heat generated in the light emitting element during the use to be efficiently equalized and dissipated. Therefore, unevenness of luminance can be constrained in the emission area.

Additionally, in the organic EL device of the first aspect, the moisture is prevented from invading in the light emitting element by a sealing function of the heat-conductive sealing stacked layer structure, so that the generation and growth of the dark spot over time due to the water and the like can be restrained. Additionally, in the organic EL device of the first aspect, a heat equalizing function of the heat-conductive sealing stacked layer structure can constrain the dark spot growth caused by the heat while constraining the generation of the unevenness of the luminance. Therefore, the organic EL device has the excellent reliability and appearance compared with the conventional organic EL device.

Preferably an extended length of the heat-conductive sealing stacked layer structure is greater than or equal to at least a half length of each corresponding side.

Accordingly, the extended length of the heat-conductive sealing stacked layer structure is greater than or equal to at least the half length of each corresponding side, so that the heat can evenly be transferred from the first electrode layer to the heat-conductive sealing layer and sufficiently be equalized.

Preferably the heat-conductive sealing layer includes at least an insulating resin film and a metallic foil, and the insulating resin film is interposed between the adhesive layer and the metallic foil.

Accordingly, the insulating resin film and the metallic foil are used as the heat-conductive sealing layer, so that the feature of the thin organic EL device is hardly lost.

Additionally, the insulating resin film is interposed between the adhesive layer and the metallic foil, so that the insulating resin film and the metallic foil can be bonded to each other irrespective of the conductive property of the adhesive layer.

Preferably the heat-conductive sealing layer includes two insulating resin films and a metallic foil, and the metallic foil is interposed between the two insulating resin films.

Additionally, the metallic foil is coated with the two insulating resin films, so that the high sealing performance is achieved.

Preferably the insulating resin film is made of at least one of materials selected from a group consisting of polyethylene terephthalate, polyvinylidene chloride, and polytetrafluoroethylene.

Preferably the current carrying area includes a feeding area that can electrically be connected to an external power supply, and a first electrode communication unit electrically connected to the first electrode layer in the emission area and a second electrode communication unit electrically connected to the second electrode layer in the emission area are located in the feeding area, the first electrode communication unit and the second electrode communication unit being located on at least one side of the transparent substrate.

Additionally, because the region through which the power can be fed to the first electrode layer and second electrode layer in the emission area concentrate on one side, the power is easily fed to the organic EL element in the emission area. That is, the power can be fed only by connecting a power supply terminal connected to the external power supply on one side.

Preferably the current carrying area includes a feeding area that can electrically be connected to the external power supply, two first electrode communication units electrically connected to the first electrode layer in the emission area and a second electrode communication unit electrically connected to the second electrode layer in the emission area are located in the feeding area, the two first electrode communication units and the second electrode communication unit being located on at least one side of the transparent substrate, and one of the first electrode communication units, the second electrode communication unit, and the other of the first electrode communication units are arrayed in parallel in this order along the one side of the transparent substrate.

Additionally, in the structure of the organic EL device, the two first electrode communication units that are of feeding electrodes to the first electrode layer in the emission area and the one second electrode communication unit that is of a feeding electrode to the second electrode layer in the emission area exist, and the second electrode communication unit is sandwiched between the first electrode communication units on one side of the transparent substrate. Therefore, in the direction of one side, the power can evenly be fed to the organic EL element in the emission area, and the unevenness of the luminance can be constrained.

Preferably the current carrying area includes a feeding area that can electrically be connected to the external power supply, an island-shape isolation unit that is of a part of the first electrode layer is located in the feeding area, the island-shape isolation unit being physically separated from the first electrode layer in the emission area, and the current carrying area includes an electrode fixing unit provided in the feeding area, the second electrode layer extended from the emission area being physically connected to the isolation unit in the electrode fixing unit.

Additionally, because the isolation unit and the second electrode layer extended from the emission area are directly connected to each other with no use of the organic light emitting layer, the second electrode layer is hardly peeled off from the transparent substrate.

Preferably the current carrying area includes a feeding area that can electrically be connected to the external power supply, the feeding area includes a first feeding area located on one side of the transparent substrate and a second feeding area located on an opposite side of the one side of the transparent substrate, a the first electrode communication unit electrically connected to the first electrode layer in the emission area and a second electrode communication unit electrically connected to the second electrode layer in the emission area are located in the first feeding area, and a first electrode communication unit electrically connected to the first electrode layer in the emission area and the second electrode communication unit electrically connected to the second electrode layer in the emission area are located in the second feeding area.

Additionally, the power can be fed to the organic EL element in the emission area from either one side or the other side, so that the organic EL device is easily adapted to an installation environment.

Preferably the current carrying area includes an auxiliary electrode area that assists electric conduction in the first electrode layer, the auxiliary electrode area is extended so as to connect the first feeding area and the second feeding area, and the heat-conductive sealing stacked layer structure is extended in an extended direction of the auxiliary electrode area.

Additionally, the heat-conductive sealing stacked layer structure is extended in the auxiliary electrode area that assists electric conduction in the first electrode layer, so that the unevenness of the luminance can further be constrained from the electric and thermal viewpoints.

Preferably the current carrying area includes a feeding area that can electrically be connected to the external power supply and an auxiliary electrode area that assists electric conduction in the first electrode layer, the feeding area includes a first electrode communication unit electrically connected to the first electrode layer and a second electrode communication unit electrically connected to the second electrode layer, the first electrode communication unit and the second electrode communication unit being located on one side of the transparent substrate, the auxiliary electrode area is extended in a direction orthogonal to one side of the transparent substrate and adjacent to the emission area and the feeding area, and the first electrode layer that is extended from the emission area and located in the auxiliary electrode area is in direct contact with the electroconductive layer in a stacking direction of a stacked body to form the heat-conductive sealing stacked layer structure.

Additionally, the first electrode layer located in the auxiliary electrode area is in direct contact with the electroconductive layer having the electric conductivity higher than that of the first electrode layer in the stacking direction of the stacked body to form the heat-conductive sealing stacked layer structure, so that the electric conduction from the first electrode communication unit in the feeding area to the first electrode layer or the electric conduction from the second electrode layer to the second electrode communication unit in the feeding area can be assisted by the electroconductive layer.

Preferably the inorganic sealing layer includes an inorganic alloy layer made of a silicon alloy consisting of silicon and at least one element selected from oxygen, carbon, and nitrogen.

Preferably the inorganic sealing layer includes a first inorganic sealing layer formed by a wet process and a second inorganic sealing layer formed by a dry process.

Additionally, the inorganic sealing layer having the high sealing property is obtained by mutually complementing the first inorganic sealing layer and the second inorganic sealing layer.

Preferably the adhesive layer is made of an epoxy resin.

Preferably the organic EL device includes an emission surface that emits the light during the operation in the other principal surface of the transparent substrate. At this point, an in-plane heat distribution of the emission surface falls within a range of 95 percent or above.

Additionally, the organic EL device having the less unevenness of the luminance can be fabricated.

In accordance with a second aspect of the present invention, an organic EL device includes: an organic EL element in which a transparent oxide electrode layer, an organic light emitting layer, and a metallic electrode layer are stacked on one of principal surfaces of a square transparent insulating substrate; an emission area that emits light during operation and that is observable when the transparent substrate is viewed in a planar view, an inorganic sealing layer, an adhesive layer, and a heat-conductive sealing layer being stacked on the organic EL element including at least the emission area; and a current carrying area that is provided outside the emission area and along a part or whole of an outer edge of the emission area and that is observable when the transparent insulating substrate is viewed in a planar view, wherein a heat-conductive sealing stacked layer structure is formed in the current carrying area, the transparent oxide electrode layer extended from the emission area, the metallic electrode layer, the inorganic sealing layer, the adhesive layer, and the heat-conductive sealing layer being stacked in this order so as to be in contact with each other in the heat-conductive sealing stacked layer structure, and the heat-conductive sealing stacked layer structure having a linear or planar shape is located near one of or all the sides of the transparent substrate, and extended along each corresponding side.

The organic EL device of the second aspect is a bottom emission type organic EL device in which the light is taken out from the transparent substrate side. That is, the first electrode layer of the transparent oxide electrode layer constitutes an anode electrode, and the metallic electrode layer constitutes a cathode electrode.

Additionally, the heat generated in the organic EL element during the use can efficiently be equalized while the moisture is prevented from invading in the organic EL element.

In accordance with a third aspect of the present invention, a manufacturing method includes: an organic EL element forming step of forming an organic EL element on a transparent substrate; an inorganic sealing layer forming step of forming an inorganic sealing layer; and a heat-conductive sealing layer bonding step of bonding a heat-conductive sealing layer to the inorganic sealing layer using an adhesive layer, wherein the organic EL element forming step includes a first removing step of partially removing a stacked body located above the first electrode layer and a second electrode stacking step of stacking the second electrode layer on a removed region in which the stacked body is partially removed.

The heat-conductive sealing stacked layer structure can easily be formed by the method of the third aspect.

Preferably the electroconductive layer is the second electrode layer, and the second electrode layer stacked on the removed region constitutes a part of a heat-conductive sealing stacked layer structure.

Additionally, because the electroconductive layer is the second electrode layer, the heat-conductive sealing stacked layer structure can be formed without newly forming the electroconductive layer.

Preferably the organic EL element forming step includes: an isolation unit forming step of forming an isolation unit physically separated from the first electrode layer in the emission area; an organic light emitting layer stacking step of stacking an organic light emitting layer on at least the isolation unit; an organic light emitting layer removing step of partially removing the organic light emitting layer; and a second electrode stacking step of stacking the second electrode layer on the removed region.

In accordance with a fourth aspect of the present invention, a manufacturing method includes: an organic EL element forming step of forming an organic EL element on a transparent substrate; an inorganic sealing layer forming step of forming an inorganic sealing layer; and a heat-conductive sealing layer bonding step of bonding a heat-conductive sealing layer to the inorganic sealing layer using an adhesive layer, wherein the inorganic sealing layer forming step includes a step of forming a first inorganic sealing layer by a CVD method and a step of forming a second inorganic sealing layer by silica conversion.

The inorganic sealing layer having the high sealing property can be formed by the method of the fourth aspect.

Preferably a raw material of the second inorganic sealing layer is polysilazane.

Effect of Invention

In the configurations of the aspects of the present invention, the luminance distribution can be decreased in the emission area because the heat generated in the organic EL element during the use is efficiently equalized, and the generation of a luminous defect can be constrained because the moisture is effectively prevented from invading in the organic EL element.

MODES FOR CARRYING OUT INVENTION

Figure 1:
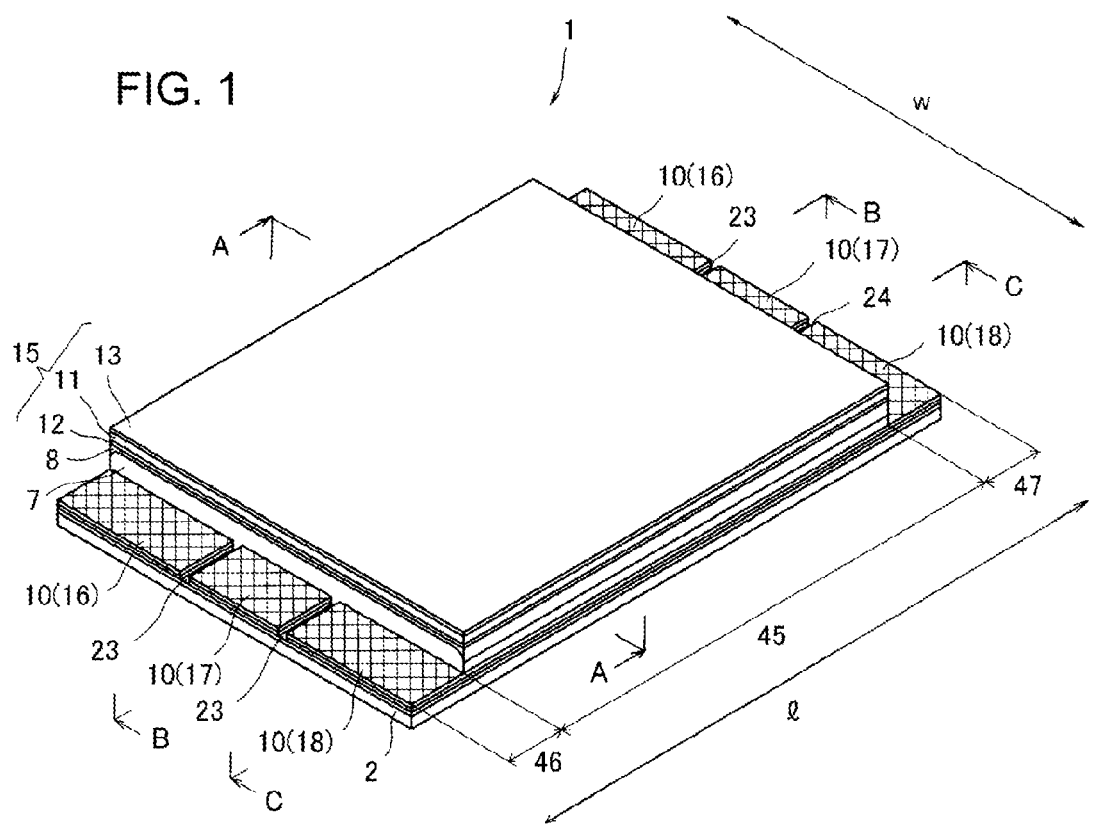
FIG. 1 is a perspective view conceptually illustrating an organic EL device according to an embodiment of the present invention when the organic EL device is viewed from a back side.

The present invention relates to an organic EL device. FIG. 1 illustrates an organic EL device 1 according to a first embodiment of the present invention. Unless otherwise noted, a positional relationship of up-and-down and right- and left directions is described based on a posture in FIG. 1. That is, a light extracting side during use becomes downside.

Unless otherwise noted, the following physical property expresses a physical property in a standard state.

Figure 2:
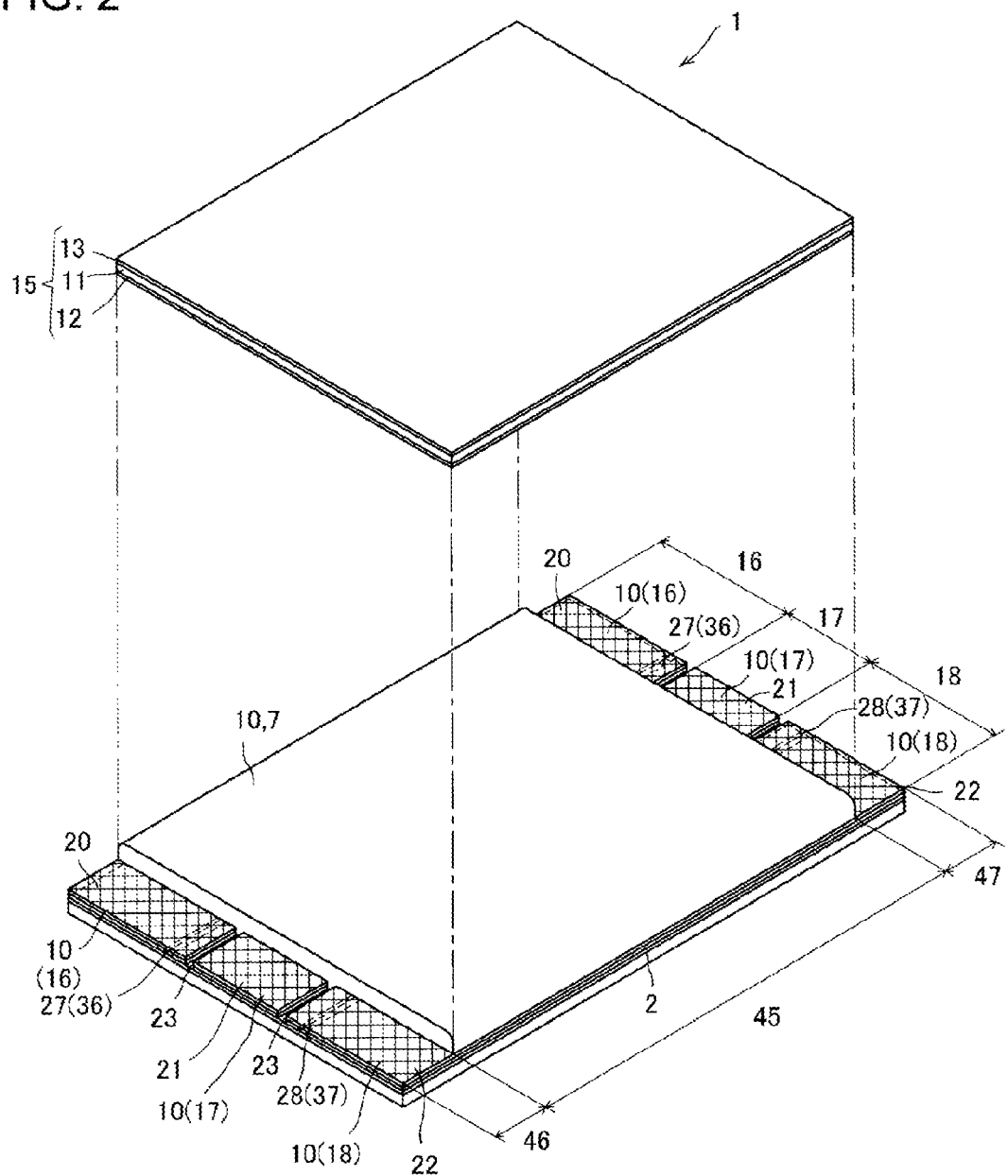
FIG. 2 is an exploded perspective view illustrating the organic EL device in FIG. 1, in which a heat-conductive sealing layer is detached and an adhesive layer is removed.
Figure 6:
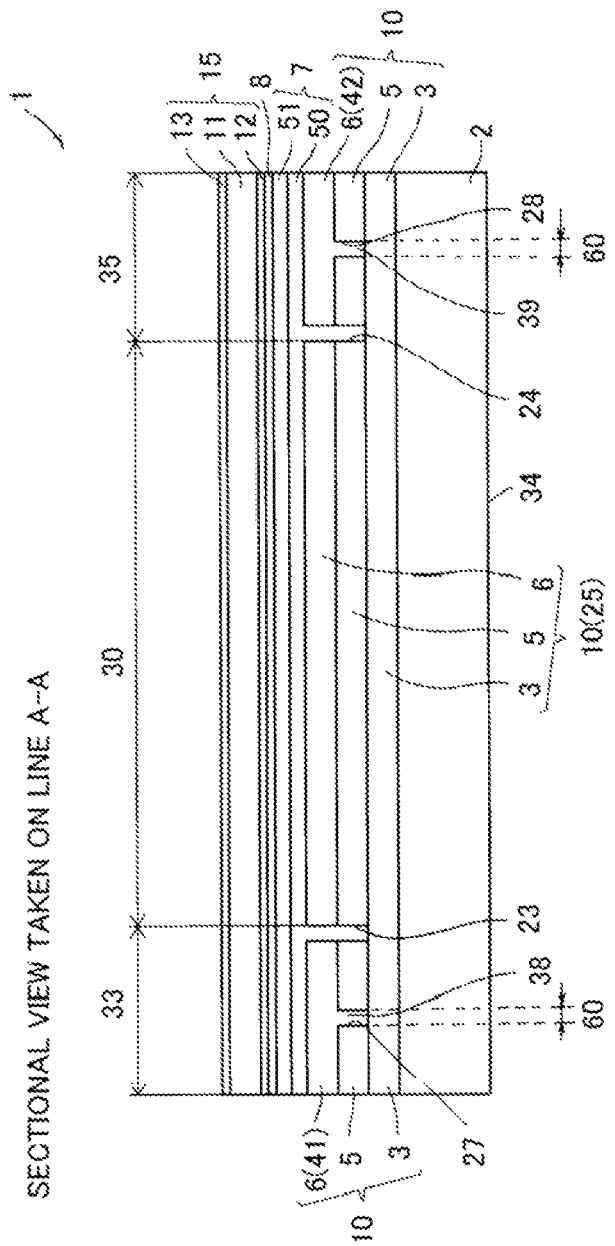
FIG. 6 is a sectional view taken on a line A-A of the organic EL device in FIG. 1, and hatching is omitted for the purpose of easy understanding.

As illustrated in FIGS. 1, 2, and 6, in the organic EL device 1 of the first embodiment, an organic EL element 10 is stacked on a principal plane of a rectangular transparent substrate 2, and an inorganic sealing layer 7 is stacked on the organic EL element 10 to seal the organic EL element 10. In the organic EL device 1, a heat-conductive sealing layer 15 is placed on the inorganic sealing layer 7, and bonded to the inorganic sealing layer 7 with an adhesive layer 8 interposed therebetween.

In the organic EL element 10, as illustrated in FIG. 6, a first electrode layer 3 (transparent oxide electrode layer), a functional layer 5 (organic light emitting layer), and a second electrode layer 6 (metallic electrode layer) are sequentially stacked from the side of the transparent substrate 2 (transparent insulating substrate) having translucency.

Figure 3:
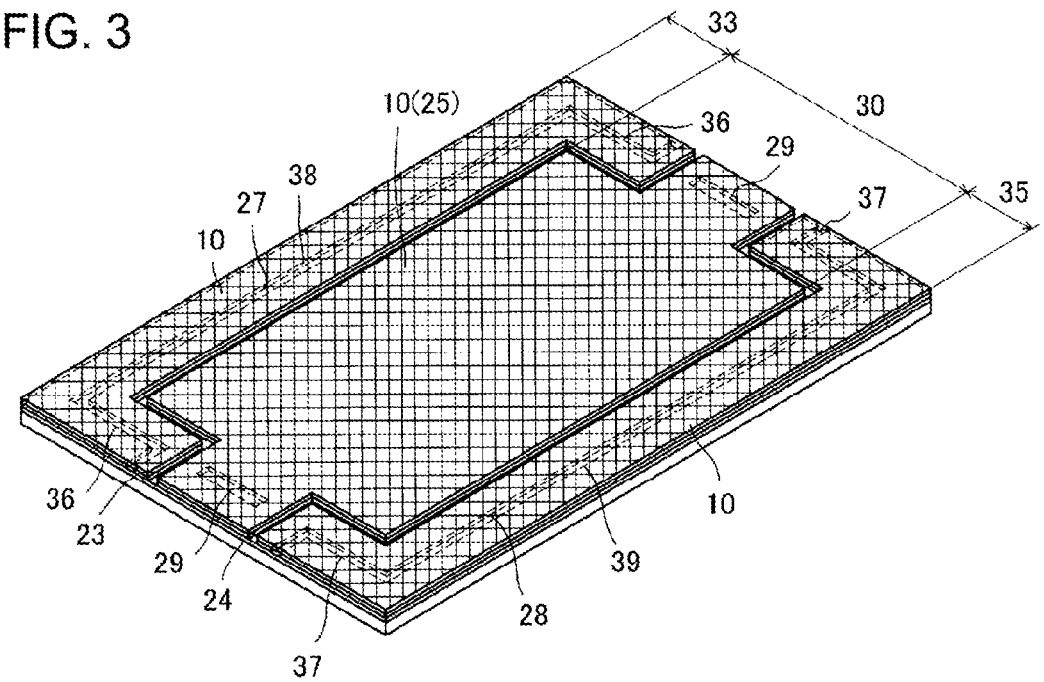
FIG. 3 is a perspective view illustrating the organic EL device in FIG. 2 in which an inorganic sealing layer is further removed.

In the organic EL device 1 of the present embodiment, as illustrated in FIG. 3, the organic EL element 10 on the transparent substrate 2 are divided into plural areas by plural grooves.

Figure 5:
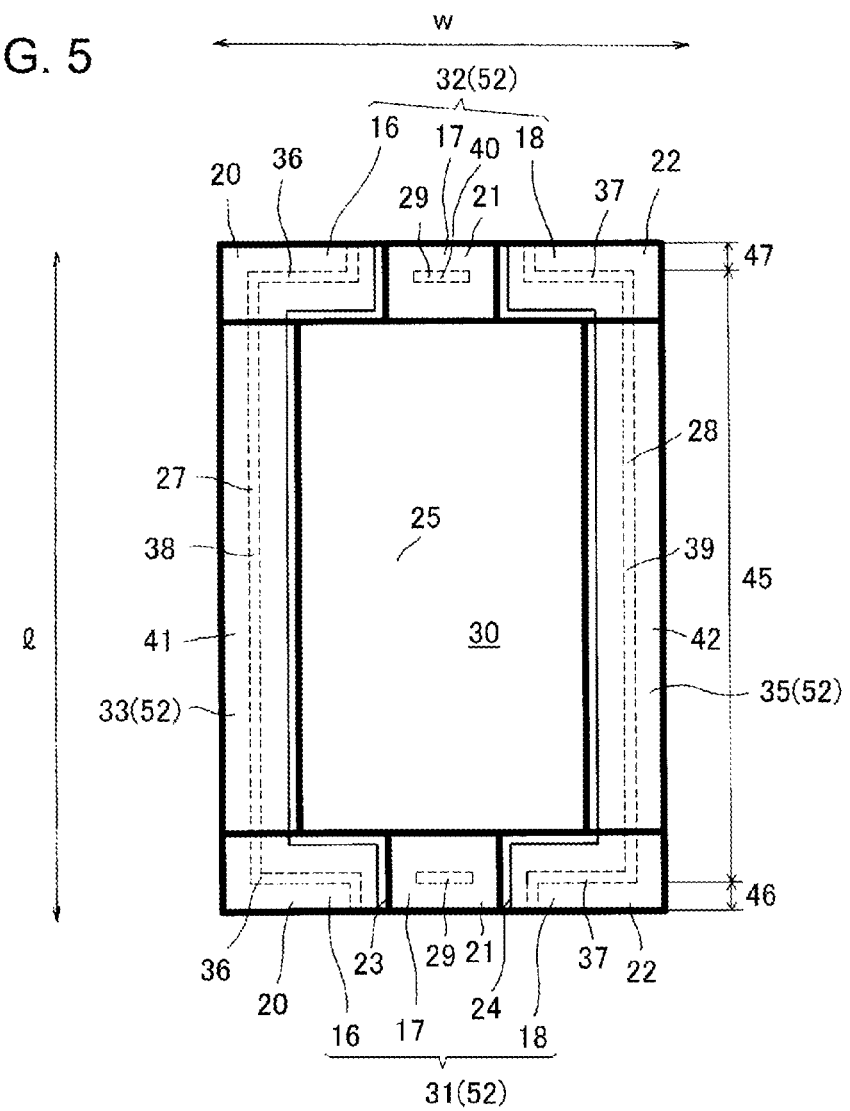
FIG. 5 is an explanatory view illustrating each area of the organic EL device in the state of FIG. 3.

Specifically, as illustrated in FIGS. 3 and 5, a plane of the organic EL device 1 is divided into an emission area 30 that actually emits light during use and a current carrying area 52.

The current carrying area 52 is divided into feeding areas 31 and 32 that contributes power feeding during the use (during operation) and auxiliary electrode areas 33 and 35 that assist current conduction.

As illustrated in FIG. 5, the current carrying area 52 is located outside the emission area 30, and arranged along a part or whole of an outer edge of the emission area 30. In other words, the current carrying area 52 is arranged so as to surround the outside of the emission area 30. In the first embodiment, the current carrying area 52 is arranged along the whole outer edge of the emission area 30.

For the sake of convenience, first a characteristic configuration and a positional relationship of the first embodiment will be described, and a configuration of each layer of the organic EL device 1 will be described in detail later.

As illustrated in FIG. 5, the emission area 30 is located in the center of the organic EL device 1 in a width direction w and a length direction 1 (a direction orthogonal to the width direction w and also orthogonal to a member thickness direction). The feeding areas 31 and 32 and the auxiliary electrode areas 33 and 35 are arranged around the emission area 30 so as to be adjacent to the edge of the emission area 30.

As illustrated in FIGS. 3 and 6, the emission area 30 is divided by area isolation grooves 23 and 24.

The first electrode layer 3, the functional layer 5, and the second electrode layer 6 overlap with one another to form the organic EL element 10 in the emission area 30. During the use (during the operation) of the organic EL device 1, a voltage is applied between the first electrode layer 3 and second electrode layer 6 in the emission area 30, and the functional layer 5 emits the light with a planar expanse.

Hereinafter, the organic EL element 10 located in the emission area 30 is referred to as a light emitting element 25.

As described above, the light emitting element 25 is located in the emission area 30, and the emission area 30 includes an emission surface 34 that actually emits the light on a principal surface (light extraction plane) on the side opposite to the principal plane on which the organic EL element 10 of the transparent substrate 2 is stacked. That is, the emission surface 34 is a surface from which the light is extracted, and a surface from which the user can visually recognize the light emission during the use.

The feeding areas 31 and 32 receives power supplied from an external power supply. As illustrated in FIG. 5, the feeding areas 31 and 32 are located on the outside in the length direction 1 (longitudinal direction) of the area isolation grooves 23 and 24. In other words, the feeding area 31 (first feeding area) and the feeding area 32 (second feeding area) are opposed to each other in the length direction 1 while the emission area 30 is sandwiched therebetween.

The feeding areas 31 and 32 are located near two sides (in the first embodiment, short sides opposed to each other) opposed to each other in the transparent substrate 2, respectively. In other words, the feeding areas 31 and 32 are located near both ends in the length direction 1, respectively.

Figure 4:
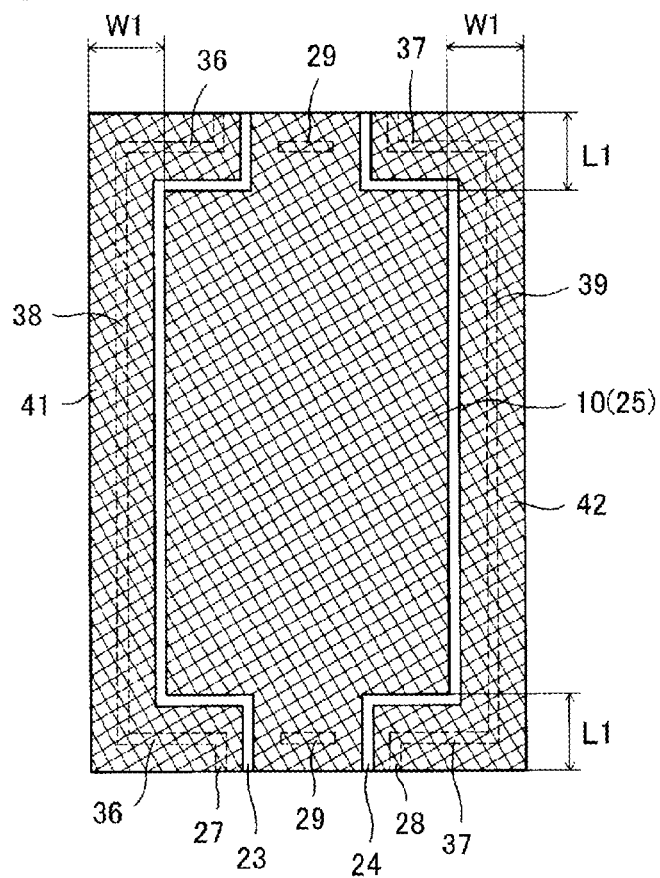
FIG. 4 is a plan view of the organic EL device in a state of FIG. 3.

The feeding areas 31 and 32 are extended from the short sides of the transparent substrate 2 toward a central side in the longitudinal direction 1. In the feeding areas 31 and 32, a width L1 (an extended length in the length direction 1) in FIG. 4 is less than or equal to a quarter of a width (a length of the whole length direction 1) of the transparent substrate 2.

As illustrated in FIG. 5, the feeding areas 31 and 32 are each divided into three areas by the two area isolation grooves 23 and 24.

Specifically, each of the feeding areas 31 and 32 is divided into anode-side feeding areas 16 and 18 where the current is supplied from the outside and a cathode-side feeding area 17 where the current flows to the outside.

The cathode-side feeding area 17 is located in the center of the organic EL device 1 in the width direction w, and the anode-side feeding areas 16 and 18 are located on the outsides of the cathode-side feeding areas 17 in the width direction w.

That is, in the width direction w, the anode-side feeding area 16, the cathode-side feeding area 17, and the anode-side feeding area 18 are sequentially arranged in each of the feeding areas 31 and 32.

Figure 8:
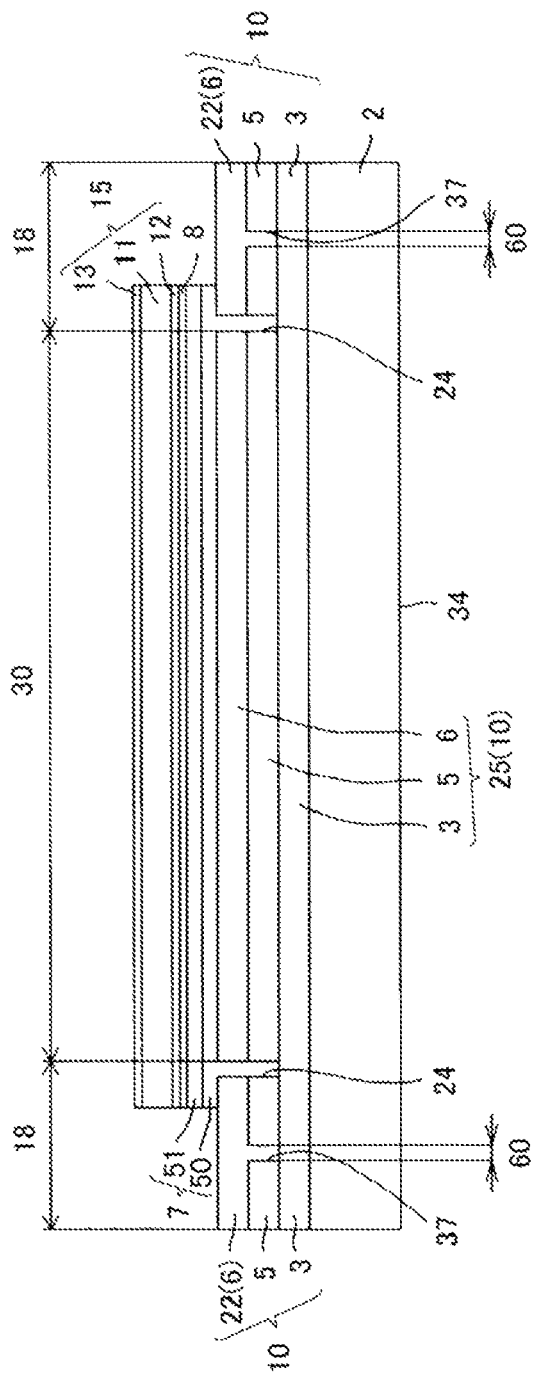
FIG. 8 is a sectional view taken on a line C-C of the organic EL device in FIG. 1, and hatching is omitted for the purpose of easy understanding.

As can be seen from FIGS. 5 and 8, the second electrode layers 6 and 6 located in the anode-side feeding areas 16 and 16 are electrically connected to the first electrode layer 3 in the emission area 30, and act as anode feeding units 20 and 20 (first electrode communication unit) that can feed the power to the first electrode layer 3.

The second electrode layers 6 located in the cathode-side feeding areas 17 and 17 are electrically connected to the second electrode layer 6 (in the first embodiment, continuously connected to the second electrode layer 6 in the emission area 30) in the emission area 30, and act as cathode feeding units 21 and 21 (second electrode communication unit) that can feed the power to the second electrode layer 6 in the emission area 30.

The second electrode layers 6 and 6 located in the anode-side feeding areas 18 and 18 are electrically connected to the first electrode layer 3 in the emission area 30 similarly to the second electrode layer 6 of the anode-side feeding area 16, and act as anode feeding units 22 and 22 (first electrode communication unit) that can feed the power to the first electrode layer 3. That is, in the feeding areas 31 and 32, the anode feeding unit 20, the cathode feeding unit 21, and the anode feeding unit 22 are arranged in parallel in the width direction w.

Hereinafter, the second electrode layer 6 in the anode-side feeding area 16 is also referred to as the anode feeding unit 20 (first electrode communication unit), the second electrode layer 6 in the cathode-side feeding areas 17 is also referred to as the cathode feeding unit 21 (second electrode communication unit), and the second electrode layer 6 in the anode-side feeding area 18 is also referred to as the anode feeding unit 22 (first electrode communication unit).

As illustrated in FIG. 5, in the organic EL device 1, the auxiliary electrode areas 33 and 35 are provided along the edges on both the sides of the emission area 30 in the width direction w. That is, the auxiliary electrode areas 33 and 35 are provided on both the outside of the emission area 30 in the width direction w such that the emission area 30 is sandwiched therebetween.

The auxiliary electrode areas 33 and 35 are located near two sides opposed to each other in the transparent substrate 2 and near the two sides except sides corresponding to the feeding areas 31 and 32.

In the first embodiment, the auxiliary electrode area 33 and 35 are formed along long sides of the transparent substrate 2, and located neat the ends in the crosswise direction w.

The auxiliary electrode areas 33 and 35 are extended toward the center from the long sides of the transparent substrate 2. In the auxiliary electrode areas 33 and 35, a width W1 (a length in the longitudinal direction 1) in FIG. 4 is less than or equal to a quarter of the width of the transparent substrate 2.

As illustrated in FIG. 6, the second electrode layers 6 and 6 located in the auxiliary electrode areas 33 and 35 are in direct contact with the first electrode layers 3 and 3 in the auxiliary electrode areas 33 and 35 to be electrically connected to the first electrode layers 3 and 3, and act as auxiliary electrode layers 41 and 42 that assist the power feeding to the first electrode layers 3 and 3.

Hereinafter, the second electrode layer 6 of the auxiliary electrode area 33 is also referred to as the auxiliary electrode layer 41, and the second electrode layer 6 of the auxiliary electrode area 35 is also referred to as the auxiliary electrode layer 42.

Thus, the emission area 30 is surrounded by the two feeding areas 31 and 32 extended in the width direction w and the two auxiliary electrode areas 33 and 35 extended in the longitudinal direction 1.

As described above, the organic EL device 1 of the first embodiment is divided into the plural segments by the plural grooves having different depths.

Figure 9:
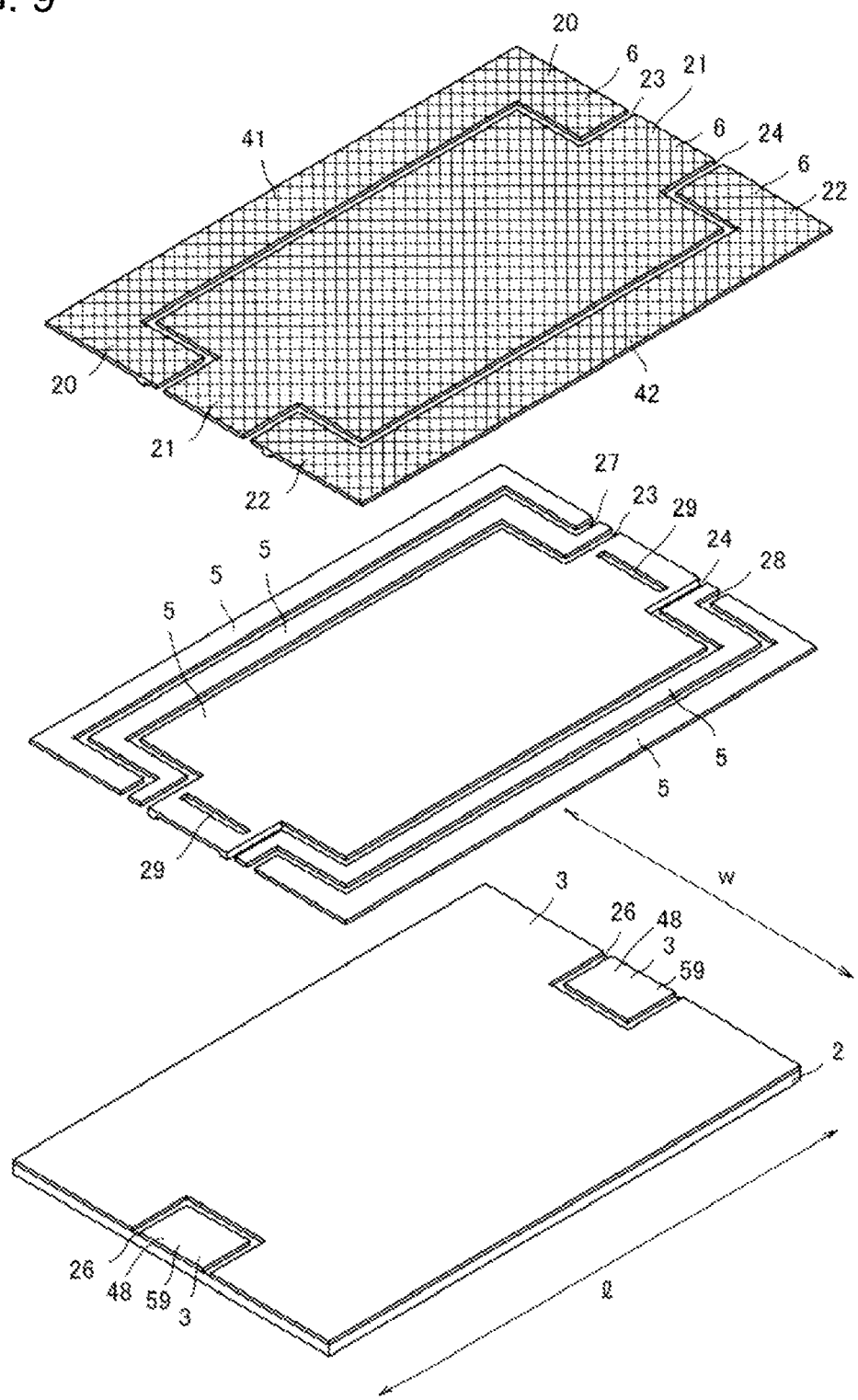
FIG. 9 is a perspective view in which a second electrode layer and a functional layer, which constitute an organic EL element, are taken out from a transparent substrate in FIG. 3.

Specifically, as illustrated in FIG. 9, the organic EL device 1 includes an extraction electrode isolation groove 26 where the first electrode layer 3 is partially removed, the area isolation grooves 23 and 24 where the second electrode layer 6 and the functional layer 5 are partially removed, electrode connection grooves 27 and 28 where the functional layer 5 is partially removed, and an extraction electrode fixing groove 29 where the functional layer 5 is partially removed, and the organic EL device 1 is divided into the plural segments by the grooves.

Each groove will be described in detail. As illustrated in FIG. 9, the extraction electrode isolation groove 26 divides the first electrode layer 3 stacked on the transparent substrate 2 into three areas. The extraction electrode isolation groove 26 divides the cathode-side feeding areas 17 and 17 in the feeding areas 31 and 32 from the emission area 30.

Figure 7:
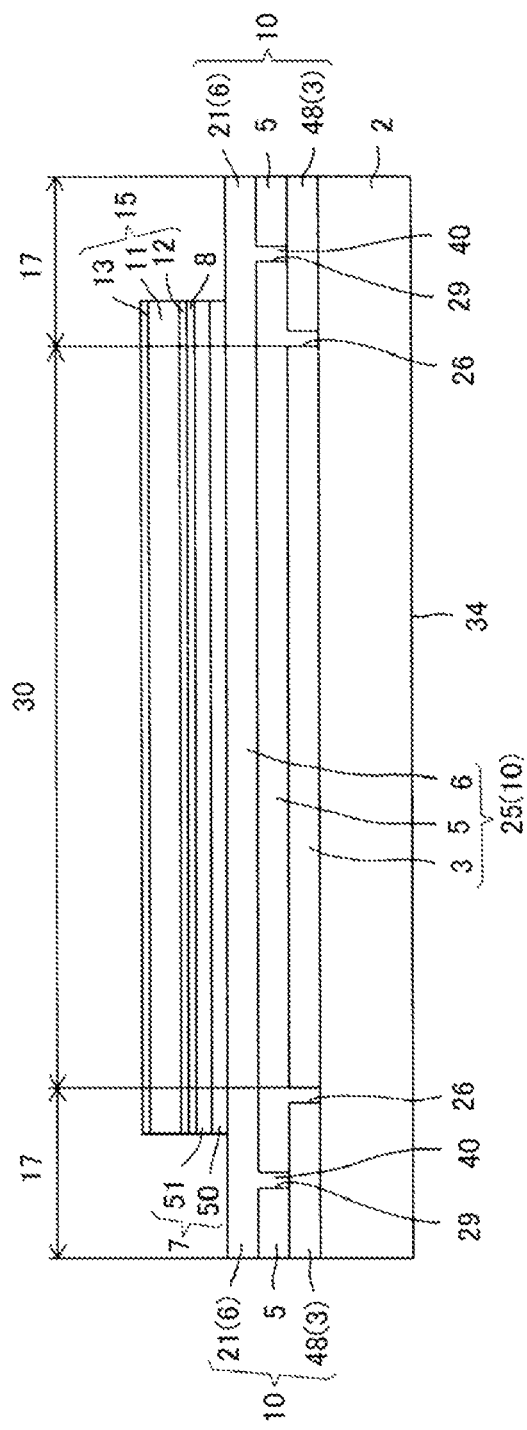
FIG. 7 is a sectional view taken on a line B-B of the organic EL device in FIG. 1, and hatching is omitted for the purpose of easy understanding.

As illustrated in FIG. 7, the functional layer 5 proceeds partially in the extraction electrode isolation groove 26, and the functional layer 5 is in direct contact with the transparent substrate 2 in a bottom of the extraction electrode isolation groove 26. That is, the first electrode layer 3 in the emission area 30 is electrically separated from the first electrode layers 3 and 3 (isolation units 48 and 48) in the cathode-side feeding areas 17 and 17 by the functional layer 5.

As illustrated in FIG. 9, the area isolation grooves 23 and 24 are extended over the whole transparent substrate 2 in the longitudinal direction 1, and separate both the functional layer 5 and the second electrode layer 6 into plural areas. As illustrated in FIG. 5, the area isolation grooves 23 and 24 divides the organic EL device into the emission area 30, the feeding areas 31 and 32, and the auxiliary electrode areas 33 and 35.

That is, as illustrated in FIG. 5, the area isolation grooves 23 and 24 are formed along substantially the whole edge of the emission area 30. The area isolation grooves 23 and 24 are formed across a boundary region between the emission area 30 and the feeding areas 31 and 32, a boundary region between the emission area 30 and the auxiliary electrode areas 33 and 35, and a boundary region between the feeding areas 31 and 32 and the auxiliary electrode areas 33 and 35.

As illustrated in FIGS. 6 and 8, the inorganic sealing layer 7 having the insulating property proceeds partially in the area isolation grooves 23 and 24, and the inorganic sealing layer 7 is in contact with the first electrode layer 3 in the bottom of the area isolation grooves 23 and 24. That is, the functional layers 5 and second electrode layers 6 in the emission area 30, feeding areas 31 and 32, and auxiliary electrode areas 33 and 35 are electrically separated from one another, respectively, by the inorganic sealing layer 7.

As illustrated in FIG. 9, the electrode connection grooves 27 and 28 located outside the area isolation grooves 23 and 24 are wholly extended in the longitudinal direction 1, and divide only the functional layer 5 into plural areas. Specifically, the electrode connection grooves 27 and 28 are formed such that the area isolation grooves 23 and 24 are sandwiched therebetween.

As illustrated in FIG. 5, the electrode connection groove 27 is formed so as to traverse in the longitudinal direction 1 across the anode-side feeding areas 16 and 16 in the feeding areas 31 and 32 and the auxiliary electrode area 33. Similarly, the electrode connection groove 28 is formed so as to traverse in the longitudinal direction 1 across the anode-side feeding areas 18 and 18 in the feeding areas 31 and 32 and the auxiliary electrode area 35.

The electrode connection grooves 27 and 28 have the substantially same shapes as the area isolation grooves 23 and 24, and are formed in parallel to the area isolation grooves 23 and 24.

As illustrated in FIG. 8, the anode feeding unit 22 proceeds partially in the electrode connection groove 28 located in the anode-side feeding area 18, and is in contact with the first electrode layer 3 in the bottom of the electrode connection groove 28 to form an electrode connection unit 37. Immediately after the electrode connection groove 28 is formed, the first electrode layer 3 is exposed in the bottom of the electrode connection groove 28, and the first electrode layer 3 exposed to the bottom of the electrode connection groove 28 is in contact with the anode feeding unit 20.

As illustrated in FIG. 6, the auxiliary electrode layer 42 proceeds partially in the electrode connection groove 28 located in the auxiliary electrode area 35, and is in contact with the first electrode layer 3 in the bottom of the electrode connection groove 28 to form an electrode connection unit 39.

Similarly, the anode feeding unit 20 proceeds partially in the electrode connection groove 27 located in the anode-side feeding area 16, and is in contact with the first electrode layer 3 in the bottom of the electrode connection groove 27 to form an electrode connection unit 36. Immediately after the electrode connection groove 27 is formed, the first electrode layer 3 is exposed in the bottom of the electrode connection groove 27, and the first electrode layer 3 exposed to the bottom of the electrode connection groove 27 is in contact with the anode feeding unit 20.

As illustrated in FIG. 6, the auxiliary electrode layer 41 proceeds partially in the electrode connection groove 27 located in the auxiliary electrode area 33, and is in contact with the first electrode layer 3 in the bottom of the electrode connection groove 27 to form an electrode connection unit 38.

Accordingly, the anode feeding units 20 and 22 and auxiliary electrode layers 41 and 42 in FIG. 5 transmit the power fed from the outside to the first electrode layer 3 via the electrode connection units 36 to 39 to have a function of assisting the electric conduction. The anode feeding units 20 and 22 and the auxiliary electrode layers 41 and 42 are provided along the sides extended in the longitudinal direction 1, and regions of the first electrode layer 3 that are in contact with the anode feeding units 20 and 22 and the auxiliary electrode layers 41 and 42 can be put into the same potential as the anode feeding units 20 and 22 and the auxiliary electrode layers 41 and 42.

The groove widths of the electrode connection grooves 27 and 28 are not less than 30 µm and not more than 80 µm, preferably not less than 40 µm and not more than 70 µm, and more preferably not less than 45 µm and not more than 60 µm.

When viewed from the side of the first electrode layer 3, the first electrode layer 3 is in direct contact with the second electrode layer 6 having the high heat conductivity via the electrode connection grooves 27 and 28 as illustrated in FIG. 6. In other words, the first electrode layer 3 and the second electrode layer 6 are in direct contact with each other with no use of the functional layer 5 having the extremely low heat conductivity. Therefore, the heat generated in the light emitting element 25 during the use can be released to the area outside the emission area 30 via the first electrode layer 3, and released to the outside via the second electrode layer 6.

As illustrated in FIGS. 5 and 7, the extraction electrode fixing groove 29 is extended in the width direction w, and removes the functional layer 5 on the isolation unit 48.

The cathode feeding unit 21 proceeds partially in the extraction electrode fixing groove 29, and is in contact with the isolation unit 48 in the bottom of the extraction electrode fixing groove 29 to form an electrode fixing unit 40. Immediately after the extraction electrode fixing groove 29 is formed, the isolation unit 48 is partially exposed in the bottom of the extraction electrode fixing groove 29, and the isolation unit 48 exposed to the bottom of the extraction electrode fixing groove 29 is in contact with the cathode feeding unit 21.

Thus, as illustrated in FIG. 5, in the organic EL device 1, the electrode connection groove 27 and the area isolation groove 23 are arranged in the anode-side feeding areas 16 and 16 and the auxiliary electrode area 33, and the electrode connection groove 28 is arranged in the anode-side feeding areas 18 and 18 and the auxiliary electrode area 35.

The extraction electrode isolation groove 26 and the extraction electrode fixing groove 29 are arranged in the cathode-side feeding areas 17. On the other hand, the groove is not formed in the emission area 30.

As to the inorganic sealing layer 7 covering the organic EL element 10, as can be seen from FIGS. 1, 2, and 5, in the width direction w, the inorganic sealing layer 7 covers at least the whole surface of the light emitting element 25 in the emission area 30, and reaches parts or ends of the organic EL element 10 in the feeding areas 31 and 32 located on both the sides of the emission area 30.

In the length direction 1, the inorganic sealing layer 7 covers at least the whole surface of the light emitting element 25 in the emission area 30, and reaches parts or ends of the organic EL element 10 in the feeding areas 31 and 32 located on both the sides of the emission area 30.

That is, as illustrated in FIG. 2, the organic EL device 1 includes a coverage area 45 that is covered with the inorganic sealing layer 7 on the organic EL element 10 and exposed areas 46 and 47. In the exposed areas 46 and 47 located outside the coverage area 45 in the longitudinal direction 1, the anode feeding units 20 and 22 and the cathode feeding unit 21 are partially exposed. In the longitudinal direction 1, the exposed area 46 and the exposed area 47 are opposed to each other with the coverage area 45 sandwiched therebetween. The inorganic sealing layer 7 is in direct contact with the first electrode layer 3 in the area isolation groove 23.

The organic EL device 1 is electrically connected to the external power supply in the exposed areas 46 and 47 in FIG. 2, which allows the power to be fed to the light emitting element 25 in the emission area 30 located in the coverage area 45 via the anode feeding units 20 and 22 and the cathode feeding unit 21 in the exposed areas 46 and 47.

A configuration of each layer of the organic EL device 1 will be described below.

As described above, in the organic EL device 1, the organic EL element 10 is stacked on the transparent substrate 2, and the inorganic sealing layer 7, the adhesive layer 8, and the heat-conductive sealing layer 15 are sequentially stacked on the organic EL element 10.

The transparent substrate 2 is a transparent insulating substrate having the translucency and the insulating property.

There is no particular limitation to a material for the transparent substrate 2. For example, the material is properly selected from flexible film substrates and plastic substrates. Particularly, a glass substrate or a transparent film substrate is suitably used from the viewpoint of transparency or workability.

The transparent substrate 2 has a planar expanse. Specifically, the transparent substrate 2 has a polygonal shape. In the first embodiment, the transparent substrate 2 has a square shape.

There is no particular limitation to a material for the first electrode layer 3 as long as the material is transparent and conductive. For example, transparent conductive oxides such as indium tin oxide (ITO), indium zinc oxide (IZO), tin oxide ($SnO_2$), and zinc oxide (ZnO) are used as the material for the first electrode layer 3. Particularly, highly transparent ITO or IZO is used from the view point of effectively taking out the light generated from the light emitting layer of the functional layer 5. In the first embodiment, ITO is used as the first electrode layer 3.

The functional layer 5 is provided between the first electrode layer 3 and the second electrode layer 6, and includes at least one light emitting layer. The functional layer 5 is constructed with plural layers mainly made of an organic compound. The functional layer 5 can be formed by a well-known material, such as a low-molecular dye material and a conjugated high-molecular material, which is used in a general organic EL device. The functional layer 5 may have a stacked multi-layer structure including plural layers such as a hole-injection layer, a hole-transport layer, the light emitting layer, an electron-transport layer, and an electron-injection layer.

Figure 15:
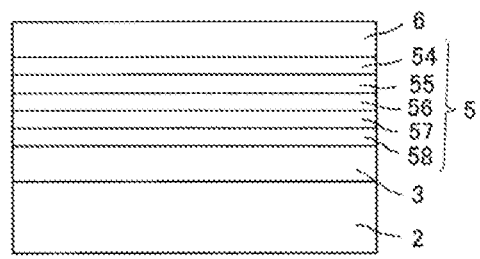
FIG. 15 is a sectional view schematically illustrating a layer structure of the organic EL device in FIG. 1, and hatching is omitted for the purpose of easy understanding.

In the first embodiment, as illustrated in FIG. 15, the functional layer 5 has a structure in which an electron-injection layer 54, an electron-transport layer 55, a light emitting layer 56, a hole-transport layer 57, and a hole-injection layer 58 are sequentially stacked from the side of the second electrode layer 6.

The electron-injection layer 54, the electron-transport layer 55, the light emitting layer 56, the hole-transport layer 57, and the hole-injection layer 58 are made of well-known materials.

These layers constituting the functional layer 5 can properly be deposited by well-known methods such as a vacuum evaporation method, a sputtering method, a CVD method, a dipping method, a roll coating method (printing method), a spin coating method, a bar coating method, a spray method, a die coating method, and a flow coating method.

There is no particular limitation to a material for the second electrode layer 6. For example, metals such as silver (Ag) and aluminum (Al) can be cited as the material for the second electrode layer 6. The second electrode layer 6 of the first embodiment is made of Al. Preferably the material for the second electrode layer 6 is deposited by the sputtering method or vacuum evaporation method.

The electric conductivity and heat conductivity of the second electrode layer 6 is larger than those of the first electrode layer 3. In other words, the second electrode layer 6 is larger than the first electrode layer 3 in electric conductivity and in heat conductivity.

There is no particular limitation to a material for the inorganic sealing layer 7 as long as the material has the insulating property and the sealing property. Preferably the inorganic sealing layer 7 is an inorganic alloy layer made of at least one kind of element selected from oxygen, carbon, and nitrogen and a silicon alloy containing silicon, and particularly preferably made of silicon nitride or silicon oxide containing bonds such as Si—O, Si—N, Si—H, and N—H and silicon oxynitride that is an intermediate solid solution of the both. The multi-layer-structure inorganic sealing layer having these structures is used in the first embodiment.

Specifically, as illustrated in FIG. 6, the inorganic sealing layer 7 is formed by sequentially stacking a first inorganic sealing layer 50 formed by a dry process and a second inorganic sealing layer 51 formed by a wet process from the side of the organic EL element 10. The first inorganic sealing layer 50 is formed by chemical vapor deposition, more particularly deposited by a plasma CVD method with silane gas or ammonia gas as a raw material.

As described later, because the first inorganic sealing layer 50 is deposited subsequent to a process of forming the organic EL element 10 under an atmosphere containing a low moisture content in a process of manufacturing the organic EL device 1, the first inorganic sealing layer 50 can be deposited without exposing the first inorganic sealing layer 50 to air or water vapor, and the generation of the initial dark spot can be reduced immediately after the use.

The second inorganic sealing layer 51 is deposited through a chemical reaction after a liquid or gel raw material is applied to the second inorganic sealing layer 51. More particularly, dense silica is used as the raw material for the second inorganic sealing layer 51. Preferably polysilazane derivative is used as the raw material for the second inorganic sealing layer 51. In the case where the second inorganic sealing layer is deposited through silica conversion using the polysilazane derivative, a weight increases during the silica conversion, and volume shrinkage decreases. There is also an advantage that a crack is hardly generated at temperatures that the resin can sufficiently withstand during the silica conversion (solidification). As used herein, the polysilazane derivative means a polymer having a silicon-nitrogen bond, and means ceramic precursor polymers such as Sift or $Si_3N_4$ containing Si—N, Si—H, and N—H and an intermediate solid solution $SiO_xN_y$. The polysilazane derivative also includes a derivative in which hydrogen bonded to Si is partially substituted with an alkyl group.

Among polysilazane derivatives, preferably perhydropolysilazane in which a chemical side chain contains only hydrogen or a derivative in which hydrogen bonded to silicon is partially substituted with a methyl group is used as the raw material for the second inorganic sealing layer 51.

Preferably the polysilazane derivative is applied and used in a solution state dissolved in an organic solvent.

Examples of the solvent include hydrocarbon solvents such as aliphatic hydrocarbon, alicyclic hydrocarbon, and aromatic hydrocarbon, a halogenated hydrocarbon solvent, and ethers such as aliphatic ether and alicyclic ether.

Because the second inorganic sealing layer 51 is densely formed compared with the first inorganic sealing layer 50, the sealing property is enhanced, the generation of the new dark spot is prevented over time, and the enlargement of the generated dark spot can be constrained.

As to the position where the inorganic sealing layer 7 is deposited, as described above, the inorganic sealing layer 7 is formed to at least the outsides of the electrode connection grooves 27 and 28 in the width direction w of the transparent substrate 2. As illustrated in FIG. 2, the inorganic sealing layer 7 of the first embodiment is wholly deposited in the width direction w. In other words, the inorganic sealing layer 7 is deposited on the whole surfaces in the emission area 30 and auxiliary electrode areas 33 and 35.

An average thickness of the inorganic sealing layer 7 is preferably ranges from 1 µm to 10 µm, more preferably ranges from 2 µm to 5 µm.

A thickness of the first inorganic sealing layer 50 constituting a part of the inorganic sealing layer 7 preferably ranges from 1 µm to 5 µm, more preferably ranges from 1 µm to 2 µm. A thickness of the second inorganic sealing layer 51 constituting a part of the inorganic sealing layer 7 preferably ranges from 1 µm to 5 µm, more preferably ranges from 1 µm to 3 µm.

The adhesive layer 8 bonding the heat-conductive sealing layer 15 and the inorganic sealing layer 7 is formed by curing an adhesive mainly containing an insulating resin. There is no particular limitation to a material for the adhesive as long as the adhesive has the bonding property and the heat conductivity after the formation of the adhesive layer 8. From the viewpoint of easy forming, preferably a thermosetting resin is used as the adhesive layer 8, more preferably an epoxy resin is used as the adhesive layer 8. In the first embodiment, the epoxy resin is used as the adhesive layer.

The heat-conductive sealing layer 15 placed above the inorganic sealing layer 7 has a heat-transfer performance and the sealing performance, and the heat-conductive sealing layer 15 is placed on the inorganic sealing layer 7 to ensure the heat dissipation, heat equalizing, and sealing functions. That is, the heat-conductive sealing layer 15 has the function of equalizing the heat generated in the light emitting element 25 during the use over the whole organic EL device 1 and the function of dissipating the heat to the outside. The heat-conductive sealing layer 15 acts as the sealing means of preventing the water and the like from invading in the organic EL element 10.

More particularly, as illustrated in FIG. 6, the heat-conductive sealing layer 15 includes a metallic foil 11 and an insulating resin film 12 that coats at least one of surfaces of the metallic foil 11 on the side of adhesive layer 8. In the first embodiment, both the surfaces of the metallic foil 11 are coated with the insulating resin films 12 and 13.

The surface of the metallic foil 11 is previously laminated using the insulating resin films 12 and 13.

An average thickness of the metallic foil 11 ranges from 6 µm to 200 µm, preferably ranges from 40 µm to 100 µm.

There is no particular limitation to a material for the metallic foil 11 as long as the material has the heat equalizing property, the heat dissipation property, and a water-vapor barrier property. For example, copper or aluminum can be used as the material, preferably the metallic foil 11 is made of aluminum. Because aluminum has a corrosion resistance property, the high heat-transfer property, and a low moisture permeability, aluminum has the high heat-transfer performance and the high sealing property. Therefore, in the first embodiment, aluminum is used as the metallic foil 11.

There is no particular limitation to a material for the insulating resin films 12 and 13 as long as the material has the insulating property. From the viewpoint of high insulating property, preferably one of polyethylene terephthalate, polyvinylidene chloride, and polytetrafluoroethylene is used as the material for the insulating resin films 12 and 13. In the first embodiment, polyethylene terephthalate is used as the insulating resin film 12 on the inorganic sealing layer side, and polytetrafluoroethylene is used as the insulating resin film 13 on the opposite side.

An average thickness of the insulating resin films 12 and 13 ranges from 5 µm to 100 µm, preferably ranges from 10 µm to 50 µm.

The heat-conductive sealing layer 15 is placed in at least the whole emission area 30, and extended to the outsides of the electrode connection grooves 27 and 28. That is, the heat-conductive sealing layer 15 covers at least the emission area 30 and parts of the auxiliary electrode areas 33 and 35.

For this reason, the heat of the whole emission area 30 can be equalized and the unevenness of the luminance light of the emitting element 25 can be prevented. Because the heat-conductive sealing layer 15 is extended to the outsides of the electrode connection grooves 27 and 28, a distance between the outside and the light emitting element 25 can be lengthened, and the water and the like can effectively be prevented from invading in the light emitting element 25.

In the first embodiment, as illustrated in FIG. 6, the area where the heat-conductive sealing layer 15 is placed is extended to the outsides of the electrode connection grooves 27 and 28 located outsides of the area isolation grooves 23 and 24. As illustrated in FIG. 2, the heat-conductive sealing layer 15 of the first embodiment covers the whole surface of the inorganic sealing layer 7. That is, the heat-conductive sealing layer 15 covers the whole surface of the inorganic sealing layer 7 except parts (exposed areas 46 and 47) of the feeding areas 31 and 32 of the organic EL device 1. Specifically, the heat-conductive sealing layer 15 covers the whole surfaces of the emission area 30 and auxiliary electrode areas 33 and 35 and the parts (exposed areas 46 and 47) of the feeding areas 31 and 32. For this reason, the water and the like can further effectively be prevented from invading in the light emitting element 25.

Thus, a heat-conductive sealing stacked layer structure 60 (see FIG. 6) is formed in the feeding areas 31 and 32 and the auxiliary electrode areas 33 and 35. In the heat-conductive sealing stacked layer structure 60, the first electrode layer 3 that is of a part of the light emitting element 25, the second electrode layer 6 having the heat conductivity larger than that of the first electrode layer 3, the inorganic sealing layer 7, the adhesive layer 8, and the heat-conductive sealing layer 15 are in direct contact with each other in this order. Specifically, the heat-conductive sealing stacked layer structure 60 exists on a projection plane of the electrode connection grooves 27 and 28 in the member thickness direction (stacking direction). That is, the first electrode layer 3, the electrode connection units 36 to 39 (electroconductive layers), the inorganic sealing layer 7, the adhesive layer 8, and the heat-conductive sealing layer 15 are stacked to form the heat-conductive sealing stacked layer structure 60.

The heat-conductive sealing stacked layer structure 60 is located near four sides of the transparent substrate 2, and located at the positions corresponding to the four sides of the transparent substrate 2. An extended length of the heat-conductive sealing stacked layer structure 60 is longer than a half of a length of each corresponding side. Preferably the extended length of the heat-conductive sealing stacked layer structure 60 is not less than two-thirds and not more than nine-tenths of each corresponding side, particularly preferably is not less than three-fourths and not more than nine-tenths.

Figure 10:
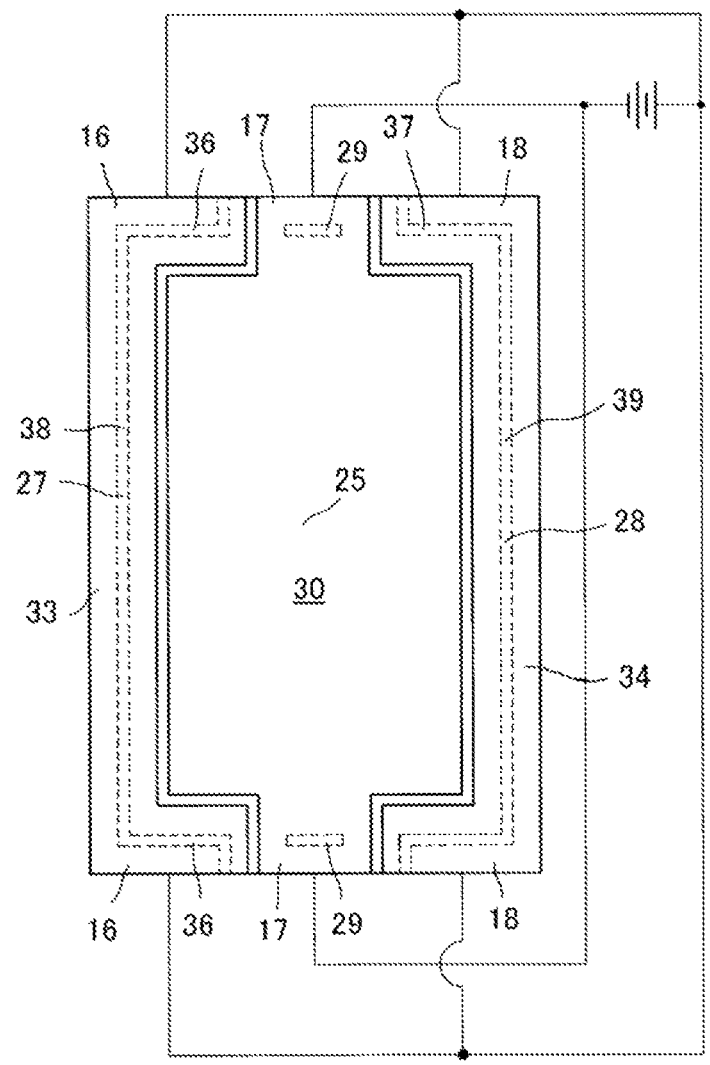
FIG. 10 is an explanatory view illustrating a current circuit used in the organic EL device in FIG. 1.

A generally-conceivable current flow will be described below. FIG. 10 illustrates an electric circuit used in the first embodiment.

For the repeat explanation of the above definition, the organic EL element 10 (the overlap portion among the first electrode layer 3, the functional layer 5, and the second electrode layer 6) located in the emission area 30 is also referred to as the light emitting element 25. The second electrode layer 6 in the anode-side feeding area 16 is also referred to as the anode feeding unit 20, the second electrode layer 6 in the anode-side feeding area 18 is also referred to as the anode feeding unit 22, and the second electrode layer 6 in the cathode-side feeding areas 17 is also referred to as the cathode feeding unit 21. The second electrode layers 6 in the auxiliary electrode areas 33 and 35 are also referred to as the auxiliary electrode layers 41 and 42.

Figure 11:
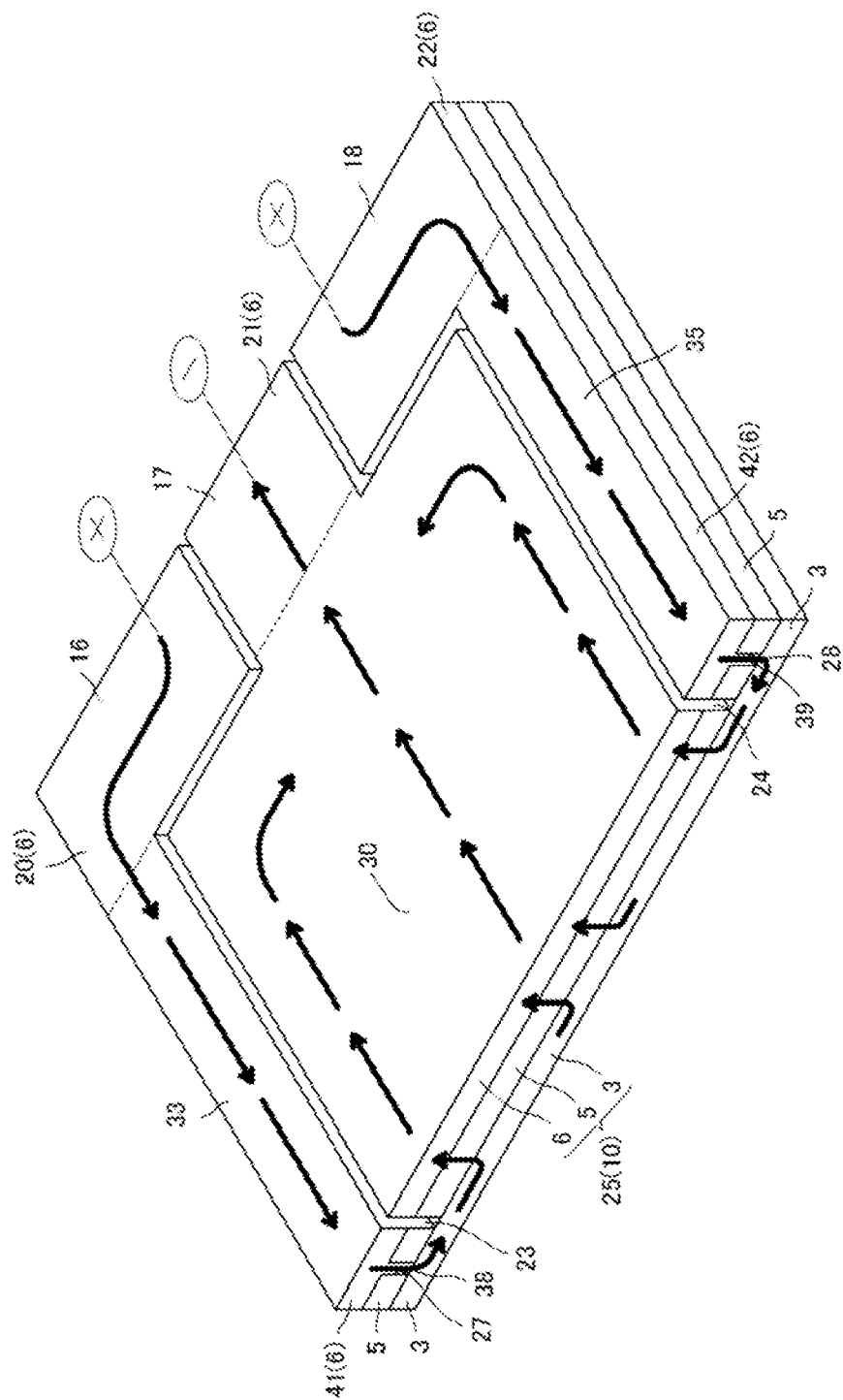
FIG. 11 is an explanatory view illustrating a current flow of the organic EL device in FIG. 1, and the current flow is indicated by an arrow.

The conceivable current flow is described below under the above assumption. As illustrated in FIG. 11, the externally-supplied current is transmitted from the anode feeding units 20 and 22 located in the exposed area 47 (see FIG. 1) to the auxiliary electrode layers 41 and 42 in the auxiliary electrode areas 33 and 35. The current is also transmitted from the anode feeding units 20 and 22 and the auxiliary electrode layers 41 and 42 to the anode-side feeding areas 16 and 18 and the first electrode layers 3 in the auxiliary electrode areas 33 and 35 via the electrode connection units 36 and 37 (see FIG. 5) in the electrode connection grooves 27 and 28 and the electrode connection units 38 and 39.

The current transmitted to the first electrode layer 3 in these areas diffuses wholly in the first electrode layer 3, and reaches the first electrode layer 3 of the light emitting element 25 in the emission area 30. In the light emitting element 25, the current reaches the second electrode layer 6 from the first electrode layer 3 via the functional layer 5.

At this point, the functional layer 5 of the light emitting element 25 emits the light, and therefore the whole emission area 30 emits the light.

The current transmitted to the second electrode layer 6 in the emission area 30 diffuses in the second electrode layer 6, and transmitted from the second electrode layer 6 in the emission area 30 to the second electrode layer 6 (cathode feeding unit 21) in the cathode-side feeding areas 17. Then, the current reaches the outside from the cathode feeding unit 21 in the cathode-side feeding areas 17.

In the configuration of the organic EL device 1, the externally-supplied current enters the organic EL device 1 from the anode-side feeding areas 16 and 18, and flows to the cathode-side feeding areas 17 via the auxiliary electrode areas 33 and 35 and the emission area 30, and the voltage is applied to the functional layer 5 to emit the light in the light emitting element 25.

Because the insides of the area isolation grooves 23 and 24 are filled with the insulating inorganic sealing layers 7, the current does not flow from the side of the emission area 30 to the sides of the auxiliary electrode areas 33 and 35. For the same reason, the current does not flow from the side of the cathode-side feeding area 17 to the sides of the anode-side feeding areas 16 and 18.

A conceivable flow of the heat generated during the use will be described below. A large part of the heat generated in the light emitting element 25 is transferred to the second electrode layer 6 in the light emitting element 25. The heat transferred to the second electrode layer 6 reaches the heat-conductive sealing layer 15 via the inorganic sealing layer 7 and the adhesive layer 8. The heat is equalized in the heat-conductive sealing layer 15, and dissipated to the outside.

The heat generated in the light emitting element 25 is partially transferred to the first electrode layer 3 in the emission area 30, and transferred to the auxiliary electrode areas 33 and 35 via the first electrode layer 3. The heat transferred to the auxiliary electrode areas 33 and 35 is transferred to the auxiliary electrode layers 41 and 42, the anode feeding units 20 and 22, and the cathode feeding unit 21 via the electrode connection units 36 to 39 in the electrode connection grooves 27 and 28. The heat transferred to the auxiliary electrode layers 41 and 42, the anode feeding units 20 and 22, and the cathode feeding unit 21 reaches the heat-conductive sealing layer 15 via the inorganic sealing layer 7 and the adhesive layer 8. The heat is equalized in the heat-conductive sealing layer 15, and dissipated to the outside.

Not only the heat is directly transferred to the heat-conductive sealing layer 15 from the emission area 30 that is of a main heat generation source, but also the heat is transferred to the heat-conductive sealing layer 15 by the heat-conductive sealing stacked layer structure 60. Because the heat is equalized in the whole region in which the heat-conductive sealing layer 15 is placed, the high temperature can be prevented from being locally generated, and the temperature can be reduce in the whole light emitting surface (emission surface). Because of the large heat dissipation area, heat dissipation efficiency is enhanced than ever before.

A method for manufacturing the organic EL device 1 of the first embodiment will be described below.

The deposition is performed with a vacuum evaporation apparatus (not illustrated) and a CVD apparatus (not illustrated), and patterning is performed with a patterning apparatus (not illustrated), a laser scriber in the first embodiment, thereby manufacturing the organic EL device 1.

First an organic EL element forming process is performed to stack the organic EL element 10 on the transparent substrate 2. Specifically, the first electrode layer 3 is deposited on part or whole of the transparent substrate 2 by the sputtering method or the CVD method (FIGS. 12A to 12B) (first electrode forming process).

At this point, the average thickness of the formed first electrode layer 3 preferably ranges from 50 nm to 800 nm, more preferably ranges from 100 nm to 400 nm.

Then, in the substrate (hereinafter, referred to as the substrate including the transparent substrate 2 and the layer stacked on the transparent substrate 2) on which the first electrode layer 3 is deposited, the extraction electrode isolation groove 26 is formed with a laser scriber (FIGS. 12B to 12C) (first electrode removing process, isolation unit forming process). At this point, the extraction electrode isolation groove 26 is formed into a "U" shape in a planar view, an island-shape extraction area 59 is formed by the short side of the substrate and the extraction electrode isolation groove 26. That is, the first electrode layer (isolation unit 48) located in the extraction area 59 and the remaining first electrode layer are physically separated from each other by the extraction electrode isolation groove 26.

On the substrate, the first electrode layer 3 exists exclusive of the extraction electrode isolation groove 26. Therefore, the extraction electrode isolation groove 26 can be formed by the laser scribing, and a masking process of hiding the deposited surface to which the deposition is not performed can be eliminated in depositing the first electrode layer 3.

Then the functional layer 5 including the hole-injection layer, the hole-transport layer, the light emitting layer, the electron-transport layer, and the electron-injection layer are sequentially deposited with the vacuum evaporation apparatus (FIGS. 12C to 12D) (functional layer stacking process, organic light emitting layer stacking process).

At this point, the functional layer 5 is stacked in the extraction electrode isolation groove 26, and the functional layer 5 is stacked on the whole surface of the substrate while the extraction electrode isolation groove 26 is filled with the functional layer 5.

Then the electrode connection grooves 27 and 28 and the extraction electrode fixing groove 29, which are one of the features of the present invention, are formed with the laser scriber in the substrate in which the functional layer 5 is deposited. In the first embodiment, the electrode connection grooves 27 and 28 and the extraction electrode fixing groove 29 are formed (FIGS. 12D to 12E) (a functional layer removing process, an organic light emitting layer removing process, and a first removing process).

At this point, the large parts of the electrode connection grooves 27 and 28 are arranged so as to be parallel to each side of the substrate, and the remaining portions of the electrode connection grooves 27 and 28 are extended in the direction orthogonal to the short side. That is, the electrode connection grooves 27 and 28 are formed over the whole substrate in the longitudinal direction, and the functional layer 5 is divided into at least three areas. Specifically, when the organic EL device 1 is completed, the electrode connection grooves 27 and 28 are provided so as to pass through the centers of the auxiliary electrode areas 33 and 35 and so as to equally divide the auxiliary electrode areas 33 and 35 into two, respectively. The extraction electrode fixing groove 29 is provided so as to equally divide the cathode-side feeding areas 17 into two in the longitudinal direction. Specifically, the extraction electrode fixing groove 29 is provided so as to equally divide the extraction area 59 into two in the longitudinal direction.

On the substrate, the functional layer 5 exists exclusive of the electrode connection grooves 27 and 28 and the extraction electrode fixing groove 29. Therefore, the electrode connection grooves 27 and 28 and the extraction electrode fixing groove 29 can be formed by the laser scribing, and the masking process of hiding the deposited surface to which the deposition is not performed can be eliminated in depositing the functional layer 5.

Then the second electrode layer 6 is deposited on the substrate with the vacuum evaporation apparatus (FIGS. 12E to 12F) (second electrode stacking process).

At this point, the second electrode layer 6 is stacked in the electrode connection grooves 27 and 28 and the extraction electrode fixing groove 29, and the second electrode layer 6 is stacked on the whole surface of the substrate while the electrode connection grooves 27 and 28 and the extraction electrode fixing groove 29 are filled with the second electrode layer 6, thereby forming the electrode connection units 37 and 38. That is, the first electrode layer 3 and the second electrode layer 6 are fixedly bonded in the bottoms of the electrode connection grooves 27 and 28 and extraction electrode fixing groove 29 while being in contact with each other, and therefore the first electrode layer 3 and the second electrode layer 6 are electrically connected to each other.

For this reason, a peeling strength can be enhanced compared with the case that the functional layer 5 is interposed between the first electrode layer 3 and the second electrode layer 6.

Figure 12:
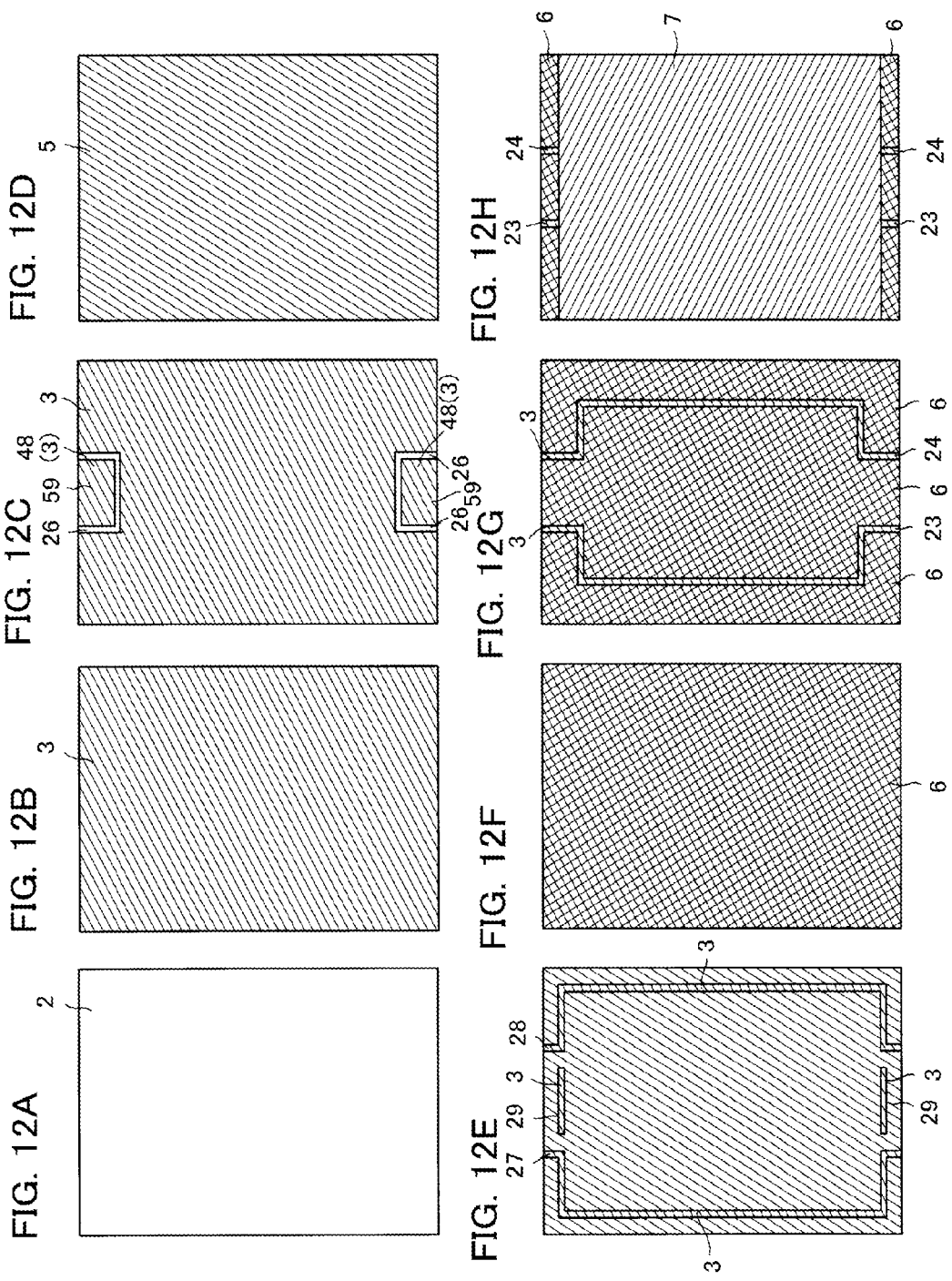
FIG. 12A to 12H are explanatory views illustrating each manufacturing process of the organic EL device in FIG. 1, and FIGS. 12A to 12H are plan views illustrating the processes.

Then, the area isolation grooves 23 and 24 extended over the functional layer 5 and the second electrode layer 6 are formed in the substrate on which the second electrode layer 6 is deposited with the laser scriber (FIGS. 12F to 12G).

At this point, the area isolation grooves 23 and 24 are formed in parallel to the electrode connection grooves 27 and 28, and formed over the whole area where the second electrode layer 6 is stacked in the longitudinal direction. The area isolation grooves 23 and 24 are formed at the boundary regions between the feeding areas 31 and 32 and the emission area 30 in forming the organic EL device 1. That is, the area isolation grooves 23 and 24 divide the functional layer 5 and the second electrode layer 6 into three areas in the width direction.

Specifically, the area isolation grooves 23 and 24 divide the second electrode layer 6 into the second electrode layer 6 constituting a part of the light emitting element 25 and the auxiliary electrode layers 41 and 42. At both the ends of the substrate in the longitudinal direction, the area isolation grooves 23 and 24 divide the second electrode layer 6 into the central cathode feeding unit 21 and the anode feeding units 20 and 22 at both the ends.

On the substrate, the second electrode layer 6 exists exclusive of the area isolation grooves 23 and 24. Therefore, the area isolation grooves 23 and 24 can be formed by the laser scribing, and the masking process of hiding the deposited surface to which the deposition is not performed can be eliminated in depositing the second electrode layer 6.

Then an inorganic sealing layer forming process is performed to form the inorganic sealing layer 7. Specifically, the first inorganic sealing layer 50 is deposited with the CVD apparatus while the substrate is partially covered with the mask.

At this point, the first inorganic sealing layer 50 covers at least the second electrode layer 6 in the emission area 30, and also covers the area isolation grooves 23 and 24. That is, the first inorganic sealing layer 50 is stacked in the area isolation grooves 23 and 24, and the area isolation grooves 23 and 24 are filled with the first inorganic sealing layer 50. For this reason, the sealing function can sufficiently be secured.

The first inorganic sealing layer 50 of the first embodiment includes the projection planes of the electrode connection grooves 27 and 28 in the member thickness direction, and reaches the long side of the substrate in the width direction. The first inorganic sealing layer 50 of the first embodiment covers the whole surface of the transparent substrate 2 except the exposed areas 46 and 47 when the organic EL device 1 is completed. Therefore, the heat-transfer property and the sealing property can further be improved.

Then, the substrate on which the first inorganic sealing layer 50 is deposited is taken out from the CVD apparatus, the raw material for the second inorganic sealing layer 51 is applied to the substrate to form the second inorganic sealing layer 51, thereby forming the inorganic sealing layer 7 (FIGS. 12G to 12H).

At this point, the whole surface of the first inorganic sealing layer 50 is covered with the second inorganic sealing layer 51.

Then a heat-conductive sealing layer bonding process is performed to bond the heat-conductive sealing layer to the inorganic sealing layer 7. Specifically, the heat-conductive sealing layer 15 is bonded onto the inorganic sealing layer 7 using the adhesive.

At this point, the heat-conductive sealing layer 15 in which the adhesive is applied to form the adhesive layer 8 is placed on the inorganic sealing layer 7, and bonded to the inorganic sealing layer 7 with a vacuum laminating machine.

The area to which the adhesive is applied includes the projection planes of the electrode connection grooves 27 and 28 in the member thickness direction, and reaches the end of the transparent substrate 2 in the width direction. In other words, the whole surface of the transparent substrate 2 except the exposed areas 46 and 47 is covered with the adhesive layer 8. As to an application quantity of the adhesive, the thickness of the adhesive layer 8 formed after the solidification is not less than 500 nm and not more than 50 μm, preferably not less than 1 μm and not more than 30 μm, particularly preferably not less than 10 μm and not more than 20 μm.

Therefore, the organic EL device 1 is completed.

A physical property of the organic EL device 1 will be described.

In the organic EL device 1, a value (in-plane luminous distribution) of a luminance in-plane distribution of the emission surface 34 falls within the range of 90 percent to 98 percent, preferably falls within the range of 94 percent to 96 percent.

In the organic EL device 1, a value (an in-plane heat distribution of the emission surface 34) of an in-plane distribution for a heat equalization evaluation of the emission surface 34 falls within the range of 90 percent to 98 percent, preferably falls within the range of 95 percent to 97 percent.

In the organic EL device 1, a value of a growth rate, which will be described below, falls within the range of 1 to 2, preferably falls within the range of 1 to 1.8.

The organic EL device 1 includes the heat-conductive sealing stacked layer structure 60 that is constructed with the transparent substrate 2, the first electrode layer 3, the electrode connection units 36 to 39, the inorganic sealing layer 7, the adhesive layer 8, and the heat-conductive sealing layer 15 so as to surround the light emitting element 25 over the substantially total length of the four sides of the organic EL device 1. For this reason, the function of the heat-conductive sealing layer 15 can effectively be exerted by the mechanical durability, heat-transfer property, and sealing property of the organic EL device 1.

In the organic EL device 1, because the heat generated in the light emitting element 25 located in the emission area 30 is effectively equalized by the heat-conductive sealing layer 15, a variation of a temperature distribution is not generated, but the temperature distribution is equalized and the high temperature is hardly generated.

Therefore, the light emitting element 25 located in the emission area 30 has the good luminance distribution. Even if the organic EL device 1 is used during the application of the power as large as 2175 W/m² or more, the generation of the heat is constrained, and the invasion of the water and the like is effectively prevented, thereby obtaining the organic EL device having the excellent appearance and the high durability.

In the organic EL device 1, the heat-conductive sealing stacked layer structure 60 in which the first electrode layer 3 and the second electrode layer 6 are in direct contact with each other with no use of the functional layer 5 is formed in the feeding areas 31 and 32 and the auxiliary electrode areas 33 and 35, so that the peeling strength can be enhanced compared with the case that the functional layer 5 is interposed between the first electrode layer 3 and the second electrode layer 6. Therefore, a gap is hardly formed between the layers, and the water and the like can be prevented from invading via the inter-layer.

In the organic EL device 1, the electrode connection units 36 to 39 constituting a part of the heat-conductive sealing stacked layer structure 60 act as the auxiliary electrodes, so that a voltage drop caused by an internal resistance can be reduced to improve power generation efficiency.

In the organic EL device 1, because the island-shape extraction area 59 isolated by the extraction electrode isolation groove 26 is formed in the cathode-side feeding area 17, the current does not flow from the outside of the extraction area 59 via the first electrode layer 3 during the use. Therefore, the emission can electrically stably be performed.

In the first embodiment, although the second electrode layer 6 is formed on the whole surface once, the present invention is not limited to this. Alternatively, a conductive material may separately be formed in the area including the electrode connection grooves 27 and 28 and an extraction groove to partially form the second electrode layer 6, or the second electrode layer 6 in the emission area 30 and the second electrode layer 6 in the area except the emission area 30 may separately be deposited using the masks such that the electrode connection grooves 27 and 28 are used as a wide separation band of the second electrode layer 6.

In the first embodiment, although the groove is mainly formed by the laser scribing, the present invention is not limited to this. Alternatively, the groove may be formed by etching, or the groove may be formed by providing the mask during the deposition.

Figure 13:
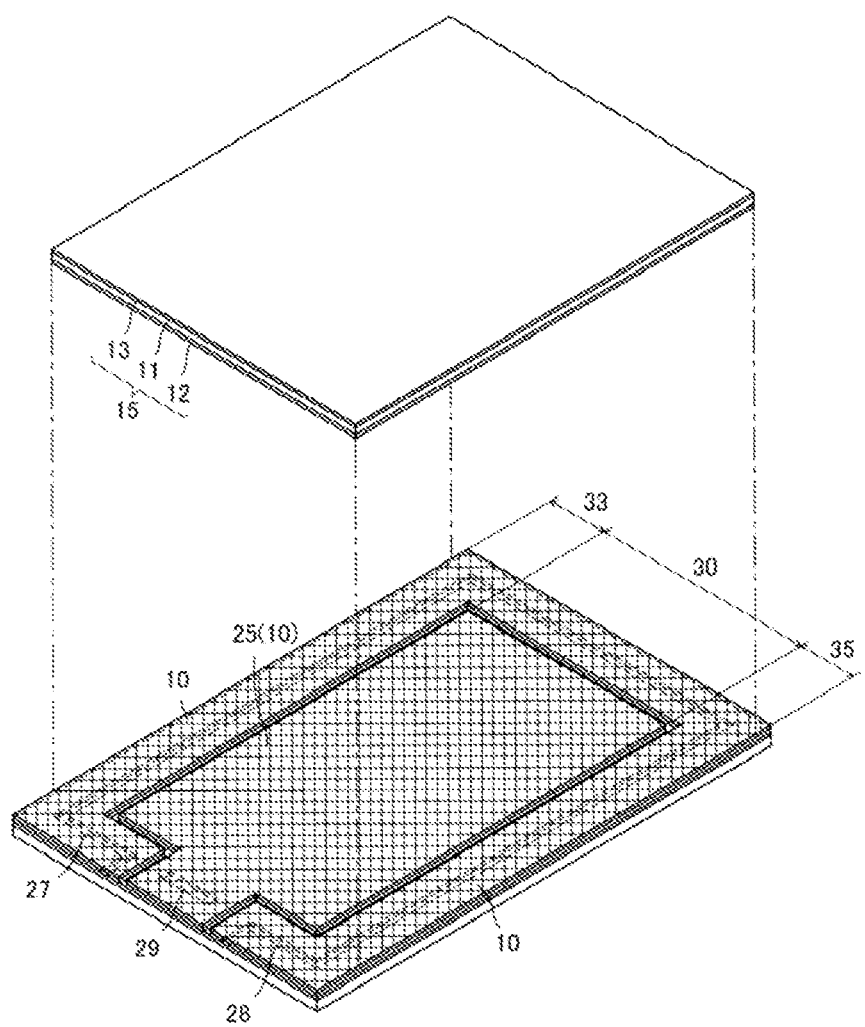
FIG. 13 is an exploded perspective view conceptually illustrating an organic EL device according to a second embodiment of the present invention when the organic EL device is observed from a back side.

In the first embodiment, although the two sides opposed to each other include the feeding areas 31 and 32, the present invention is not limited to this. Alternatively, as illustrated in FIG. 13, the feeding area may be provided in only one side.

Figure 14:
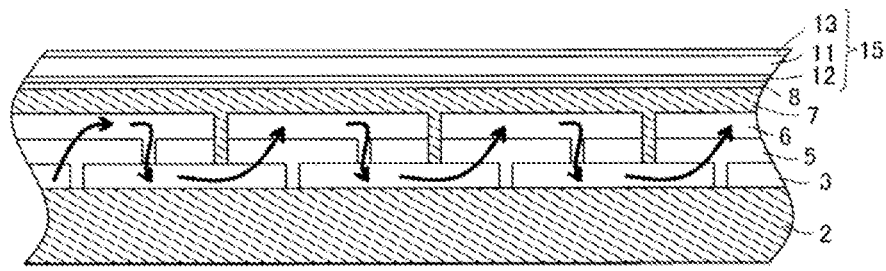
FIG. 14 is a schematic diagram illustrating an organic EL device according to a third embodiment of the present invention, and current flow is indicated by an arrow.

In the structure of the first embodiment, although the voltage is directly applied to the organic EL element in the emission area, the present invention is not limited to this. Alternatively, as illustrated in FIG. 14, the voltage may be applied to an integrated structure in the organic EL element. That is, the organic EL device may be what is called an integrated type organic EL device.

In the first embodiment, although the heat-conductive sealing stacked layer structure is linearly formed by forming the linear electrode connection groove, the present invention is not limited to this. Alternatively, the heat-conductive sealing stacked layer structure may planarly be formed by forming the planar electrode connection groove.

In the first embodiment, although the rectangular substrate is used, the present invention is not limited to this. The substrate having any shape may be used. For example, the substrate may have the square shape or a circular shape.

Although the present invention is more specifically described with the organic EL device as examples, the present invention is not limited to the examples.

EXAMPLES

A procedure to prepare the organic EL devices of the specific examples of the present invention and comparative examples and evaluation results of the specific examples and comparative examples will be described below.

First Example

The transparent insulating substrate having a size of 80 mm by 80 mm was used as the transparent substrate on which the organic EL device is formed, and alkali-free glass (thickness of 0.7 mm) in which ITO (Indium Tin Oxide, film thickness of 150 nm) is stacked as the first electrode layer 3 on the whole surface of one of surfaces was used.

The substrate was irradiated with a laser beam having a fundamental wave (1064 nm) of YAG laser from the side of the first electrode layer 3 to form the extraction electrode isolation groove 26 having the groove width of 40 μm.

The substrate was washed with a brush using a surfactant agent, and subjected to ultrasonic cleaning using pure water. Then the substrate was dried in an oven. The substrate was moved to the vacuum evaporation apparatus, and the following materials was deposited in vacuum.

The hole-injection layer having the thickness of 10 nm was deposited on the whole surface of one of the surface of the first electrode layer 3 by the vacuum evaporation method using a mixed layer of 4,4'-bis[N-(2-naphtyl)-N-phenyl-amino]biphenyl (hereinafter, abbreviated to NPB) and molybdenum trioxide. The hole-injection layer was deposited by a co-evaporation method such that a thickness ratio of NPB and molybdenum trioxide becomes 9:1.

Then the hole-transport layer having the thickness of 50 nm (evaporation rates of 0.08 nm/sec to 0.12 nm/sec) was deposited using NPB by the vacuum evaporation method.

Then the light emitting layer and electron-transport layer having the thickness of 70 nm (evaporation rates of 0.24 nm/sec to 0.28 nm/sec) was deposited using tris(8-quinolinolate)aluminum (hereinafter, abbreviated to Alq3) by the vacuum evaporation method.

Then the electron-injection layer having the thickness of 1 nm (evaporation rates of 0.03 nm/sec to 0.05 nm/sec) was deposited using LiF by the vacuum evaporation method.

Aluminum (Al) having the 300 nm (evaporation rates of 0.3 nm/sec to 0.5 nm/sec) was deposited as a part of the functional layer 5 on the electron-injection layer by the vacuum evaporation method.

Thus, the functional layer 5 was formed.

The electrode connection grooves 27 and 28 were formed in the substrate with the laser scriber. Specifically, the substrate was irradiated with a laser beam having a second harmonic (532 nm) of the YAG laser from the other side of the substrate to form the electrode connection grooves 27 and 28 having the groove width of 60 μm. At the same time, the extraction electrode fixing groove 29 having the groove width of 60 μm was formed.

Then the second electrode layer 6 having the thickness of 150 nm (evaporation rates of 0.3 nm/sec to 0.5 nm/sec) was deposited using Al by the vacuum evaporation method. The area isolation grooves 23 and 24 were formed in the substrate with the laser scriber. Specifically, the substrate was irradiated with a laser beam having the second harmonic (532 nm) of the YAG laser from the other side of the substrate to form the area isolation groove 23 and 24 having the groove width of 40 μm.

Then, the substrate was moved to the plasma CVD apparatus, a silicon nitride film having the thickness of 2 μm was formed as the first inorganic sealing layer 50, the substrate was moved from a vacuum atmosphere to a glove box filled with a nitrogen atmosphere, AQUAMICA NL120A-05 (product of Clariant) that is of the polysilazane derivative was applied and solidified to form the second inorganic sealing layer 51 such that the thickness becomes 1 um during the solidification, and the inorganic sealing layer 7 having the total thickness of 3 μm was formed to perform primary sealing.

Then, the thermosetting epoxy resin was applied as the adhesive, the heat-conductive sealing layer 15 in which the adhesive layer 8 having the thickness of 20 μm was formed is placed on the inorganic sealing layer 7, and the heat-conductive sealing layer 15 and the inorganic sealing layer 7 were bonded with the vacuum laminating machine. A milled aluminum foil (thickness of 50 μm) sandwiched between a polyethylene terephthalate (PET) resin film (thickness of 16 μm) and a polytetrafluoroethylene (PTFE) resin film (thickness of 16 μm) was used as the heat-conductive sealing layer 15, and the polyethylene terephthalate resin film was adjacent to the adhesive layer 8. Secondary sealing was performed to prepare the organic EL device including the heat-conductive sealing stacked layer structure 60, and the organic EL device was used as a first example.

Second Example

The organic EL device was prepared in the same way as the first example except that the second inorganic sealing layer 51 is not formed and that the milled aluminum foil (thickness of 50 μm) sandwiched between the two polyethylene terephthalate (PET) resin films (thickness of 16 μm) was used as the heat-conductive sealing layer 15. The secondary sealing was performed to prepare the organic EL device including the heat-conductive sealing stacked layer structure, and the organic EL device was used as a second example.

First Comparative Example

In the first example, an acrylic adhesive was used as the adhesive, and the organic EL device was prepared by bonding the polyethylene terephthalate (PET) resin sheet (thickness of 50 μm) instead of the heat-conductive sealing layer 15. In other words, the organic EL device to which the insulating resin film 12 on which the adhesive was applied to the inorganic sealing layer 7 was bonded was prepared. The secondary sealing was thus performed to prepare the organic EL device not including the heat-conductive sealing stacked layer structure, and the organic EL device was used as a first comparative example.

Second Comparative Example

The organic EL device was prepared in the same way as the first example except that the second inorganic sealing layer 51 was not formed, that a sheet constructed with an evaporated silica alumina (SiAlON) layer (thickness of 9 μm) sandwiched between the polyethylene terephthalate (PET) resin film (thickness of 12 μm) and the polytetrafluoroethylene (PTFE) resin film (thickness of 40 μm) was used instead of the heat-conductive sealing layer 15, and that the polyethylene terephthalate resin film was adjacent to the adhesive layer 8. The secondary sealing was thus performed to prepare the organic EL device not including the heat-conductive sealing stacked layer structure, and the organic EL device was used as a second comparative example.

The number of dark spots and the size of the dark spot were observed with respect to the four prepared levels (the first and second examples and the first and second comparative examples), and a temporal change, the heat equalizing property, and a luminance distribution in the emission area (emission surface) were evaluated during an energized accelerated test at a temperature of 60° C. and relative humidity of 85%.

A method for evaluating the number of dark spots and the size of the dark spot, an accelerated test method, a method for evaluating the heat equalizing property, and a method for evaluating the luminance distribution in the emission area (emission surface) are as follows.

(Method for Evaluating the Number of Dark Spots and Size of Dark Spot)

After the prepared organic EL device was subjected to the accelerated test for 1, 15, 100, 200, 300, and 500 hours by the accelerated test method, the number of dark spots and the size of the dark spot were measured with a microscope Eclipse L300 (product of Nikon).

(Accelerated Test Method)

The current of 250 mA (corresponding to 1000 cd/m²) was passed through the prepared organic EL device using a source measure unit GS610 (product of YOKOGAWA) while the temperature of 60° C. and relative humidity of 85% were maintained in a constant temperature and humidity oven.

(Method for Evaluating Heat Equalizing Property)

Figure 16:
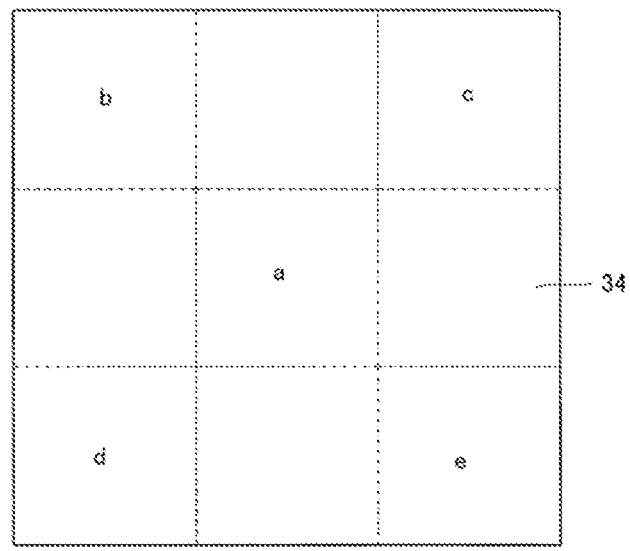
FIG. 16 is an explanatory view illustrating a measurement point of a temperature distribution in an example and a comparative example.

The current of 250 mA (corresponding to 1000 cd/m2) was passed through the prepared organic EL device using the source measure unit GS610 (product of YOKOGAWA), a thermal image of the emission surface was obtained with a thermo camera TH9100PMV (product of NECAvio) after the organic EL device was lit for 10 minutes, and temperatures were measured at five points a to e in FIG. 16.

An in-plane distribution (%) was calculated from the following equation (1) using MAX (the highest temperature in the five points) and MIN (the lowest temperature in the five points).

Formula 1

$$\text{In-plane distribution} = \left(1 - \frac{\text{MAX} - \text{MIN}}{\text{MAX} + \text{MIN}}\right) \times 100 \quad (1)$$

(Emission Area (Emission Surface) Evaluation Method)

The current of 250 mA (corresponding to 1000 cd/m2) was passed through the prepared organic EL device using the source measure unit GS610 (product of YOKOGAWA), the luminance of the emission surface was measured at five points a to e in FIG. 16 with a chromameter CS-200 (product of KONIKA MINOLTA) after the organic EL device was lit for 10 minutes, and an in-plane distribution (%) of the luminance was calculated by the method similar to the method for evaluating the in-plane distribution (%) of the heat equalizing property. The sealing structures of the organic EL devices of the first and second examples and first and second comparative examples are summarized in Table 1.

TABLE 1

| | Sealing structure on first inoganic sealing layer |
|---|---|
| First example | Silica (polysilazane) + Epoxy resin + PET/milled Al foil/PTFE |
| Second example | Epoxy resin + PET/milled Al foil/PET |
| First comparative example | Polysilazane + Acrylic adhesive + PET |
| Second comparative example | Epoxy resin + PET/evaporated SiAlON/PTFE |

In the first and second examples and first and second comparative examples, the temporal changes during the accelerated tests of the numbers of dark spots having sizes of 50 μm or more are summarized in Table 2.

TABLE 2

| | Cumulative time (h) | | | | | | |
|---|---|---|---|---|---|---|---|
| | 1 | 15 | 50 | 100 | 200 | 300 | 500 |
| First example | 5 | 5 | 5 | 5 | 5 | 5 | 5 |
| Second example | 1 | 4 | 5 | 6 | 6 | 6 | 6 |
| First comparative example | 4 | 5 | 6 | 6 | 6 | 6 | 6 |
| Second comparative example | 1 | 3 | 3 | 5 | 5 | 5 | 5 |

Unit (piece)

Figure 17:
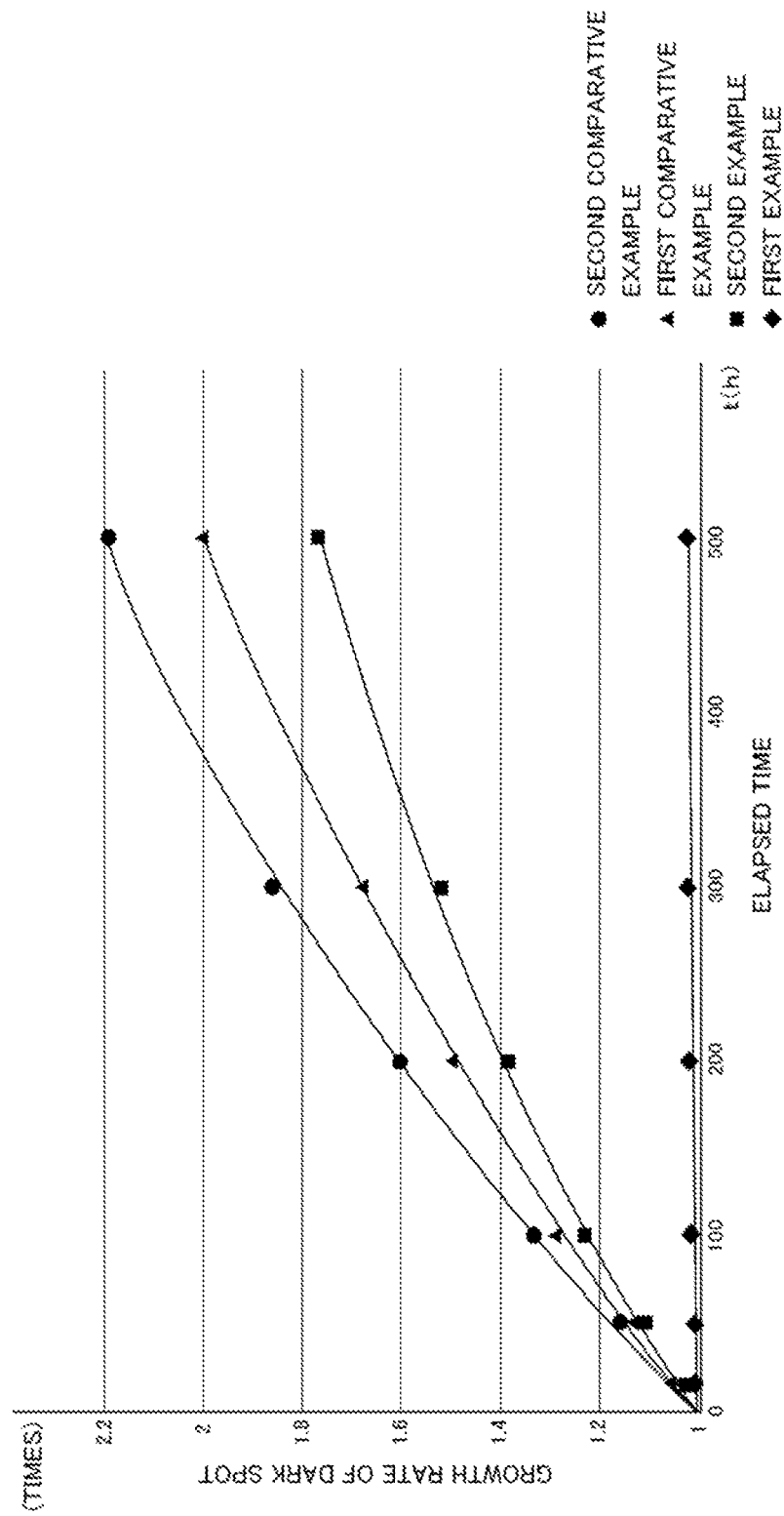
FIG. 17 is a graph illustrating a growth rate of a dark spot to an elapsed time in organic EL devices of the example and comparative example.

FIG. 17 illustrates the temporal changes of diameters of the dark spots in the first and second examples and first and second comparative examples during the accelerated tests. FIG. 17 is a graph illustrating a value in which the dark spot in each elapsed time of the first and second examples and first and second comparative examples is normalized by the dark spot size after one hour. In the graph of FIG. 17, a horizontal axis indicates the elapsed time [hour] of the accelerated test, and a vertical axis indicates the growth rate [times] of the pseudo dark spot.

The heat equalizing property evaluation results of the first and second examples and first and second comparative examples are summarized in Table 3.

TABLE 3

| | Measurement position | | | | | In-plane distribution |
|---|---|---|---|---|---|---|
| | a | b | c | d | e | |
| First example | 39.42 | 36.74 | 37.61 | 36.55 | 36.27 | 95.84% |
| Second example | 39.97 | 37.02 | 36.4 | 37.03 | 36.11 | 94.93% |
| First comparative example | 45.85 | 35.61 | 37.33 | 35.86 | 33.04 | 83.76% |
| Second comparative example | 43.68 | 35.24 | 37.2 | 35.29 | 33.43 | 86.71% |

Unit (° C.)

The luminance distribution evaluation results of the first and second examples and first and second comparative examples are summarized in Table 4.

TABLE 4

| | Measurement position | | | | | In-plane distribution |
|---|---|---|---|---|---|---|
| | a | b | c | d | e | |
| First example | 1162.06 | 1161.12 | 1144.5 | 1085.36 | 1129.1 | 96.59% |
| Second example | 1163.06 | 1160.77 | 1125.26 | 1070.8 | 1122.31 | 95.87% |
| First comparative example | 1334.98 | 1061.2 | 1030.34 | 983.55 | 934.2 | 82.34% |
| Second comparative example | 1292.92 | 1037.62 | 984.27 | 1024.13 | 993.72 | 86.45% |

Unit (cd/m²)

The experimental results are considered.

In the organic EL device of the first example, although the dark spot was formed at the initial stage of the accelerated test as illustrated in Table 2, thereafter the formed dark spot was hardly grown as illustrated in FIG. 17. Specifically, a change rate (growth rate) of the diameter of the dark spot after 500 hours to the diameter of the dark spot after 1 hour fell within the range of 1 (no growth) to 1.05. As illustrated in Table 2, in the accelerated test, the dark spot was not newly generated even if the time elapsed. As is clear from the result in Table 3, the organic EL device of the first example has the wide in-plane distribution and the good heat equalizing property compared with the first and second comparative examples. Therefore, the resultant luminance distribution is narrow as illustrated in Table 4.

In the organic EL device of the second example, as illustrated in Table 2, the number of dark spots formed at the initial stage of the accelerated test was smaller than that of the first comparative example. Although the dark spot was newly generated as time advances, the growth rate of the dark spot is small compared with the first and second comparative examples as illustrated in FIG. 17, and it is found that the dark spot was not rapidly grown. Specifically, the change rate (growth rate) of the diameter of the dark spot after 500 hours to the diameter of the dark spot after 1 hour fell within the range of 1.32 to 1.77.

As illustrated in Table 3, the organic EL device of the second example has the wide in-plane distribution and the good heat equalizing property compared with the first and second comparative examples. Therefore, the resultant luminance distribution is narrow as illustrated in Table 4.

In both the organic EL devices of the first and second comparative examples, as illustrated in Table 2, the number of dark spots formed at the initial stage of the accelerated test was larger than that of the first and second examples, and, as illustrated in FIG. 17, the size of the dark spot became large over time. As illustrated in Table 3, the organic EL devices of the first and second comparative examples have the narrow in-plane distribution and the poor heat equalizing property compared with the first and second examples. Therefore, the resultant luminance distribution is wide as illustrated in Table 4. That is, because both the organic EL devices of the first and second comparative examples have the low sealing property and the poor heat equalizing property, the dark spot is grown, and therefore the number of new dark spots is accordingly increased.

DESCRIPTION OF SYMBOLS

1 organic EL device
2 transparent substrate (transparent insulating substrate)
3 first electrode layer (transparent oxide electrode layer)
5 functional layer (organic light emitting layer)
6 second electrode layer (metallic electrode layer)
7 inorganic sealing layer
8 adhesive layer
10 organic EL element
11 metallic foil
12, 13 insulating resin film
15 heat-conductive sealing layer
20, 22 anode feeding unit (electroconductive layer, first electrode communication unit)
21 cathode feeding unit (electroconductive layer, second electrode communication unit)
25 light emitting element
30 emission area
31 feeding area (first feeding area)
32 feeding area (second feeding area)
33, 35 auxiliary electrode area
34 emission surface
40 electrode fixing unit
41, 42 auxiliary electrode layer (electroconductive layer)
48 isolation unit
50 first inorganic sealing layer
51 second inorganic sealing layer
52 current carrying area
60 heat-conductive sealing stacked layer structure

The invention claimed is:

1. An organic EL device comprising: an organic EL element in which a first electrode layer, an organic light emitting layer, and a second electrode layer are stacked on one of principal surfaces of a polygonal transparent substrate;
   an emission area that emits light during operation and that is observable when the transparent substrate is viewed in a planar view,
   an inorganic sealing layer, an adhesive layer, and a heat-conductive sealing layer being stacked on the organic EL element including at least the emission area; and
   a current carrying area that is provided outside the emission area and along a part or whole of an outer edge of the emission area and that is observable when the transparent substrate is viewed in a planar view, wherein a heat-conductive sealing stacked layer structure is formed in the current carrying area, the first electrode layer that is extended from the emission area into the current carrying area along a plane of the transparent substrate, an electroconductive layer having a heat conductivity larger than that of the first electrode layer, the inorganic sealing layer, the adhesive layer, and the heat-conductive sealing layer being stacked in this order so as to be in contact with each other in the heat-conductive sealing stacked layer structure, and
   the heat-conductive sealing stacked layer structure having a linear or planar shape is located near one of or all the sides of the transparent substrate, and extended along each corresponding side, wherein
   in the current carrying area, the first electrode layer and the electroconductive layer are electrically connected through a groove that is configured in the organic light emitting layer, and
   in at least a part of the current carrying area, the organic light emitting layer is interposed between the first electrode layer and the electroconductive layer outside an area of the groove.

2. The organic EL device according to claim 1, wherein an extended length of the heat-conductive sealing stacked layer structure is greater than or equal to at least a half length of each corresponding side.

3. The organic EL device according to claim 1, wherein the heat-conductive sealing layer includes at least an insulating resin film and a metallic foil, and
   the insulating resin film is interposed between the adhesive layer and the metallic foil.

4. The organic EL device according to claim 1, wherein the heat-conductive sealing layer includes two insulating resin films and a metallic foil, and
   the metallic foil is interposed between the two insulating resin films.

5. The organic EL device according to claim 3, wherein the insulating resin film is made of at least one of materials selected from a group consisting of polyethylene terephthalate, polyvinylidene chloride, and polytetrafluoroethylene.

6. The organic EL device according to claim 4, wherein the insulating resin film is made of at least one of materials selected from a group consisting of polyethylene terephthalate, polyvinylidene chloride, and polytetrafluoroethylene.

7. The organic EL device according to claim 1, wherein the current carrying area includes a feeding area that can electrically be connected to an external power supply, and a first electrode communication unit electrically connected to the first electrode layer in the emission area and a second electrode communication unit electrically connected to the second electrode layer in the emission area are located in the feeding area, the first electrode communication unit and the second electrode communication unit being located on at least one side of the transparent substrate.

8. The organic EL device according to claim 1, wherein the current carrying area includes a feeding area that can electrically be connected to the external power supply,
two first electrode communication units electrically connected to the first electrode layer in the emission area and a second electrode communication unit electrically connected to the second electrode layer in the emission area are located in the feeding area, the two first electrode communication units and the second electrode communication unit being located on at least one side of the transparent substrate, and one of the first electrode communication units, the second electrode communication unit, and the other of the first electrode communication units are arrayed in parallel in this order along the one side of the transparent substrate.

9. The organic EL device according to claim 1, wherein the current carrying area includes a feeding area that can electrically be connected to the external power supply,
an island-shape isolation unit that is of a part of the first electrode layer is located in the feeding area, the island-shape isolation unit being physically separated from the first electrode layer in the emission area, and
the current carrying area includes an electrode fixing unit provided in the feeding area, the second electrode layer extended from the emission area being physically connected to the isolation unit in the electrode fixing unit.

10. The organic EL device according to claim 1, wherein the current carrying area includes a feeding area that can electrically be connected to the external power supply,
the feeding area includes a first feeding area located on one side of the transparent substrate and a second feeding area located on an opposite side of the one side of the transparent substrate,
a first electrode communication unit electrically connected to the first electrode layer in the emission area and a second electrode communication unit electrically connected to the second electrode layer in the emission area are located in the first feeding area, and
a first electrode communication unit electrically connected to the first electrode layer in the emission area and a second electrode communication unit electrically connected to the second electrode layer in the emission area are located in the second feeding area.

11. The organic EL device according to claim 10, wherein the current carrying area includes an auxiliary electrode area that assists electric conduction in the first electrode layer,
the auxiliary electrode area is extended so as to connect the first feeding area and the second feeding area, and
the heat-conductive sealing stacked layer structure is extended in an extended direction of the auxiliary electrode area.

12. The organic EL device according to claim 1, wherein the current carrying area includes a feeding area that can electrically be connected to the external power supply and an auxiliary electrode area that assists electric conduction in the first electrode layer,
the feeding area includes a first electrode communication unit electrically connected to the first electrode layer and a second electrode communication unit electrically connected to the second electrode layer, the first electrode communication unit and the second electrode communication unit being located on one side of the transparent substrate,
the auxiliary electrode area is extended in a direction orthogonal to one side of the transparent substrate and adjacent to the emission area and the feeding area, and
the first electrode layer that is extended from the emission area and located in the auxiliary electrode area is in direct contact with the electroconductive layer in a stacking direction of a stacked body to form the heat-conductive sealing stacked layer structure.

13. The organic EL device according to claim 1, wherein the inorganic sealing layer includes an inorganic alloy layer made of a silicon alloy consisting of silicon and at least one element selected from oxygen, carbon, and nitrogen.

14. The organic EL device according to claim 1, wherein the inorganic sealing layer includes a first inorganic sealing layer formed by a wet process and a second inorganic sealing layer formed by a dry process.

15. The organic EL device according to claim 1, wherein the adhesive layer is made of an epoxy resin.

16. The organic EL device according to claim 1, further comprising an emission surface that emits light during the operation in the other principal surface of the transparent substrate, wherein
an in-plane luminous distribution of the emission surface falls within a range between 90 percent and 98 percent inclusive.

17. An organic EL device comprising: an organic EL element in which a transparent oxide electrode layer, an organic light emitting layer, and a metallic electrode layer are stacked on one of principal surfaces of a square transparent insulating substrate;
an emission area that emits light during operation and that is observable when the transparent substrate is viewed in a planar view,
an inorganic sealing layer, an adhesive layer, and a heat-conductive sealing layer being stacked on the organic EL element including at least the emission area; and
a current carrying area that is provided outside the emission area and along a part or whole of an outer edge of the emission area and that is observable when the transparent substrate is viewed in a planar view, wherein
a heat-conductive sealing stacked layer structure is formed in the current carrying area, the transparent oxide electrode layer that is extended from the emission area into the current carrying area along a plane of the transparent insulating substrate, the metallic electrode layer, the inorganic sealing layer, the adhesive layer, and the heat-conductive sealing layer being stacked in this order so as to be in contact with each other in the heat-conductive sealing stacked layer structure, and
the heat-conductive sealing stacked layer structure having a linear or planar shape is located near one of or all the sides of the transparent insulating substrate, and extended along each corresponding side, wherein
in the current carrying area, the first electrode layer and the electroconductive layer are electrically connected through a groove that is configured in the organic light emitting layer, and
in at least a part of the current carrying area, the organic light emitting layer is interposed between the first electrode layer and the electroconductive layer outside an area of the groove.

18. A method for manufacturing the organic EL device according to claim 1, the method comprising:
- an organic EL element forming step of forming an organic EL element on a transparent substrate;
- an inorganic sealing layer forming step of forming an inorganic sealing layer; and
- a heat-conductive sealing layer bonding step of bonding a heat-conductive sealing layer to the inorganic sealing layer using an adhesive layer, wherein
- the organic EL element forming step includes a first removing step of partially removing a stacked body located above the first electrode layer and
- a second electrode stacking step of stacking the second electrode layer on a removed region in which the stacked body is partially removed.

19. The organic EL device manufacturing method according to claim 18, wherein the electroconductive layer is the second electrode layer, and
- the second electrode layer stacked on the removed region constitutes a part of a heat-conductive sealing stacked layer structure.

20. The organic EL device manufacturing method according to claim 18, wherein the organic EL element forming step includes: an isolation unit forming step of forming an isolation unit physically separated from the first electrode layer in the emission area;
- an organic light emitting layer stacking step of stacking an organic light emitting layer on at least the isolation unit;
- an organic light emitting layer removing step of partially removing the organic light emitting layer; and
- a second electrode stacking step of stacking the second electrode layer on the removed region.

21. A method for manufacturing the organic EL device according to claim 13,
the method comprising: an organic EL element forming step of forming an organic EL element on a transparent substrate;
- an inorganic sealing layer forming step of forming an inorganic sealing layer; and
- a heat-conductive sealing layer bonding step of bonding a heat-conductive sealing layer to the inorganic sealing layer using an adhesive layer, wherein
- the inorganic sealing layer forming step includes a step of forming a first inorganic sealing layer by a CVD method and a step of forming a second inorganic sealing layer by silica conversion.

22. The organic EL device manufacturing method according to claim 21, wherein a raw material of the second inorganic sealing layer is polysilazane.

23. A method for manufacturing the organic EL device according to claim 14,
the method comprising: an organic EL element forming step of forming an organic EL element on a transparent substrate;
- an inorganic sealing layer forming step of forming an inorganic sealing layer; and
- a heat-conductive sealing layer bonding step of bonding a heat-conductive sealing layer to the inorganic sealing layer using an adhesive layer, wherein
- the inorganic sealing layer forming step includes a step of forming a first inorganic sealing layer by a CVD method and a step of forming a second inorganic sealing layer by silica conversion.

24. The organic EL device manufacturing method according to claim 23, wherein a raw material of the second inorganic sealing layer is polysilazane.

* * * * *